(12) United States Patent
Matsuda

(10) Patent No.: US 10,652,349 B2
(45) Date of Patent: May 12, 2020

(54) MANAGING DISTRIBUTED DATA BY CALCULATING CO-OCCURRENCE PROBABILITIES OF COMBINATIONS OF FIRST IDENTIFICATION INFORMATION ITEMS FOR DEVICE INFORMATION ITEMS AND COMPRESSING THE DEVICE INFORMATION ITEMS USING THE A SECOND IDENTIFICATION INFORMATION ASSIGNED TO THE FIRST INFORMATION ITEMS BASED ON THE CO-OCCURRENCE PROBABILITIES

(71) Applicant: FUJITSU LIMITED, Kawasaki-shi, Kanagawa (JP)

(72) Inventor: Kazuhito Matsuda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 274 days.

(21) Appl. No.: 15/945,416

(22) Filed: Apr. 4, 2018

(65) Prior Publication Data
US 2018/0302488 A1    Oct. 18, 2018

(30) Foreign Application Priority Data

Apr. 13, 2017  (JP) ................................. 2017-079739

(51) Int. Cl.
*H04L 29/08* (2006.01)
*G06N 7/00* (2006.01)
(Continued)

(52) U.S. Cl.
CPC ......... *H04L 67/2828* (2013.01); *G06N 5/022* (2013.01); *G06N 7/005* (2013.01);
(Continued)

(58) Field of Classification Search
CPC . H04L 67/2828; H04L 67/2833; H04L 67/04; H04L 67/2823; H04L 69/04;
(Continued)

(56) References Cited

U.S. PATENT DOCUMENTS 9,171,079 B2 * 10/2015 Banka ..................... H04L 67/12
9,225,793 B2 * 12/2015 Dutta ..................... H04L 67/12
(Continued)

FOREIGN PATENT DOCUMENTS

JP    2005-277978    10/2005

*Primary Examiner* — Daniel C. Murray
(74) *Attorney, Agent, or Firm* — Fujitsu Patent Center

(57) ABSTRACT

A method, which is performed by a computer for management of distributed data, includes: associating device information items including information acquired from devices with first identification information items to be used to identify the devices and storing the device information items and the first identification information items in a storage device; calculating co-occurrence probabilities of combinations of the associated first identification information items for the device information items stored in the storage device; assigning second identification information items to the first identification information items based on the co-occurrence probabilities; generating compressed data by compressing the device information items using the second identification information items assigned to the first identification information items associated with the device information items upon the compression of the device information items; and transmitting the compressed data to a managing device.

7 Claims, 24 Drawing Sheets

(51) Int. Cl.
  *H03M 7/30* (2006.01)
  *G06N 5/02* (2006.01)
  *H04L 29/06* (2006.01)

(52) U.S. Cl.
  CPC .......... *H03M 7/3057* (2013.01); *H04L 67/04* (2013.01); *H04L 67/1097* (2013.01); *H04L 67/2823* (2013.01); *H04L 67/2833* (2013.01); *H04L 69/04* (2013.01); *H03M 7/30* (2013.01)

(58) Field of Classification Search
  CPC ... H04L 67/1097; H03M 7/3057; H03M 7/30; G06N 5/022; G06N 7/005
  See application file for complete search history.

(56) References Cited

U.S. PATENT DOCUMENTS

| | | | | |
|---|---|---|---|---|
| 9,275,093 | B2* | 3/2016 | Pandey | G06F 16/2264 |
| 9,372,922 | B2* | 6/2016 | Shaashua | H04W 4/70 |
| 10,158,483 | B1* | 12/2018 | Newman | H04L 9/0891 |
| 10,296,258 | B1* | 5/2019 | Richardson | H04L 67/1095 |
| 2009/0006589 | A1* | 1/2009 | Forbes | H04L 67/16 |
| | | | | 709/223 |
| 2010/0281079 | A1* | 11/2010 | Marwah | G06F 16/284 |
| | | | | 707/812 |
| 2012/0197852 | A1* | 8/2012 | Dutta | H04L 67/2804 |
| | | | | 707/692 |
| 2012/0197898 | A1* | 8/2012 | Pandey | G06F 16/2264 |
| | | | | 707/741 |
| 2012/0197911 | A1* | 8/2012 | Banka | H04L 67/12 |
| | | | | 707/752 |
| 2014/0359035 | A1* | 12/2014 | Wang | H04L 51/06 |
| | | | | 709/206 |
| 2015/0172120 | A1* | 6/2015 | Dwarampudi | H04L 67/1097 |
| | | | | 709/221 |
| 2016/0105308 | A1* | 4/2016 | Dutt | G06N 3/0472 |
| | | | | 709/221 |
| 2016/0212245 | A1* | 7/2016 | Shoaib | H04L 67/12 |
| 2017/0063630 | A1* | 3/2017 | Olmsted-Thompson | |
| | | | | H04L 41/12 |
| 2017/0192860 | A1* | 7/2017 | Vijayan | G06F 3/0641 |
| 2017/0235647 | A1* | 8/2017 | Kilaru | G06F 11/2094 |
| | | | | 707/652 |
| 2018/0091630 | A1* | 3/2018 | Yeung | H04L 43/024 |
| 2018/0124174 | A1* | 5/2018 | Swallow | H04L 67/1097 |
| 2018/0241852 | A1* | 8/2018 | Maluf | H04L 12/40013 |
| 2018/0253251 | A1* | 9/2018 | Hayasaka | G06F 3/0608 |
| 2018/0338017 | A1* | 11/2018 | Mekuria | H04L 69/04 |
| 2019/0044726 | A1* | 2/2019 | Macieira | H04L 67/2833 |
| 2019/0098089 | A1* | 3/2019 | Shim | H04L 67/12 |
| 2019/0124156 | A1* | 4/2019 | Nolan | H04L 67/2833 |
| 2019/0132269 | A1* | 5/2019 | Nolan | H04L 51/046 |

* cited by examiner

| DEVICE ID | DYNAMIC ID | Ver. |
|---|---|---|
| 04a6ba33... | 1 | |
| ⋮ | ⋮ | 4 |
| ggdfasb3... | 3 | |

| PAIR OF DEVICE IDs | | CO-OCCURRENCE PROBABILITY |
|---|---|---|
| DEVICE ID (X) | DEVICE ID (Y) | |
| 04a6ba33... | ggdfasb3... | 0.88 |
| ⋮ | ⋮ | ⋮ |

FIG. 12

201a (ASSOCIATION TABLE #1)

| gwID | DEVICE ID | DYNAMIC ID |
|---|---|---|
| 101 | 04a6ba33... | 1 |
| | ⋮ | ⋮ |
| | ggdfasb3... | 3 |

(ASSOCIATION TABLE #3)

| gwID | DEVICE ID | DYNAMIC ID |
|---|---|---|
| 103 | gafds3xy... | 1 |
| | ⋮ | ⋮ |
| | l1r2kf3t... | 5 |

| gwID | Ver. |
|---|---|
| 101 | 4 |
| ⋮ | ⋮ |
| 103 | 5 |

Step.1

SORTING IN ASCENDING ORDER (OR DESCENDING ORDER) AND CALCULATION OF DIFFERENCES
ex.) {2, 5, 10, 12} → {2, 3, 5, 2}

Step.2

ENCODING (REPRESENTATION COMPRESSED BASED ON DELIMITER BIT)
ex.) 2 = 00000000 00000010
→ 0 00000010 (TOP "0" = DELIMITER BIT)

COMPRESSED DATA (111f)

MANAGING DISTRIBUTED DATA BY CALCULATING CO-OCCURRENCE PROBABILITIES OF COMBINATIONS OF FIRST IDENTIFICATION INFORMATION ITEMS FOR DEVICE INFORMATION ITEMS AND COMPRESSING THE DEVICE INFORMATION ITEMS USING THE A SECOND IDENTIFICATION INFORMATION ASSIGNED TO THE FIRST INFORMATION ITEMS BASED ON THE CO-OCCURRENCE PROBABILITIES

CROSS-REFERENCE TO RELATED APPLICATION

This application is based upon and claims the benefit of priority of the prior Japanese Patent Application No. 2017-079739, filed on Apr. 13, 2017, the entire contents of which are incorporated herein by reference.

FIELD

The embodiments discussed herein are related to a method, an apparatus for managing distributed data, and a non-transitory computer-readable storage medium.

BACKGROUND

In each of electronic devices such as personal computers (PCs), smartphones, and car navigation systems, a central processing unit (CPU), a memory, and a communication interface for providing a communication function are installed in many cases. Such electronic devices communicate information with other electronic devices via wired or wireless networks such as local area networks (LANs) or wide area networks (WANs). The electronic devices are referred to as Internet of Things (IoT) devices in some cases.

A technique for using, as data storage, an IoT device connected to a network is being studied. For example, a system in which an IoT device used as data storage is set in a gateway (GW) device, and data output from the GW device or a sensor of the IoT device connected to the GW device is temporarily accumulated in the GW device is being studied.

Data accumulated in GW devices and the GW devices are managed by a data center connected to the GW devices via a network, for example. For example, IoT devices that have output data, information identifying GW devices accumulating the data, and directory information including key information to be used to search data and the like are managed by the data center. A user who wants to use specific data makes an inquiry to the data center, acquires directory information, references the acquired directory information, and detects a GW device accumulating the specific data.

A communication system in which a single master device and multiple slave devices that are connected to each other in series communicate with each other based on identification numbers has been proposed. In this communication system, a slave device automatically sets a self-identification number based on a numerical value, transmitted by a higher-level device, for setting the identification number and transmits the numerical value for setting the identification number to the next slave device based on the self-identification number. By this process, identification numbers are automatically set in all the slave devices.

Examples of the related art include Japanese Laid-open Patent Publication No. 2005-277978.

SUMMARY

According to an aspect of the embodiment, a method which is performed by a computer for management of distributed data includes: associating device information items including information acquired from devices with first identification information items to be used to identify the devices and storing the device information items and the first identification information items in a storage device; calculating co-occurrence probabilities of combinations of the associated first identification information items for the device information items stored in the storage device; assigning second identification information items to the first identification information items based on the co-occurrence probabilities; generating compressed data by compressing the device information items using the second identification information items assigned to the first identification information items associated with the device information items upon the compression of the device information items; and transmitting the compressed data to a managing device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a diagram illustrating an example of an association table;

FIG. 12 is a diagram illustrating an example of an association table group;

DESCRIPTION OF EMBODIMENTS

As described above, if a data center holds directory information on data accumulated in a GW device, a user may acquire desired data from the GW device without the upload of all the data by the GW device to the data center. The GW device, however, executes a process of transmitting the directory information on the data accumulated in the GW device to the data center.

If the size of each data item of directory information is small, and a large number of GW devices transmit the directory information to the data center, a network load is large. Thus, the directory information may be compressed and transmitted. If IDs that are randomly selected from a wide namespace such as universally unique identifier (UUID) v4 are included in the directory information, the directory information may not be efficiently compressed.

According to an aspect of the present disclosure, a technique for transmitting data compressed at a high rate to a managing device even if a combination of devices from which information is acquired is changed is provided.

Hereinafter, embodiments are described with reference to the accompanying drawings. Elements that have substantially the same function are indicated by the same reference symbol in the present specification and the drawings, and duplicated descriptions are omitted.

1. First Embodiment

Figure 1:
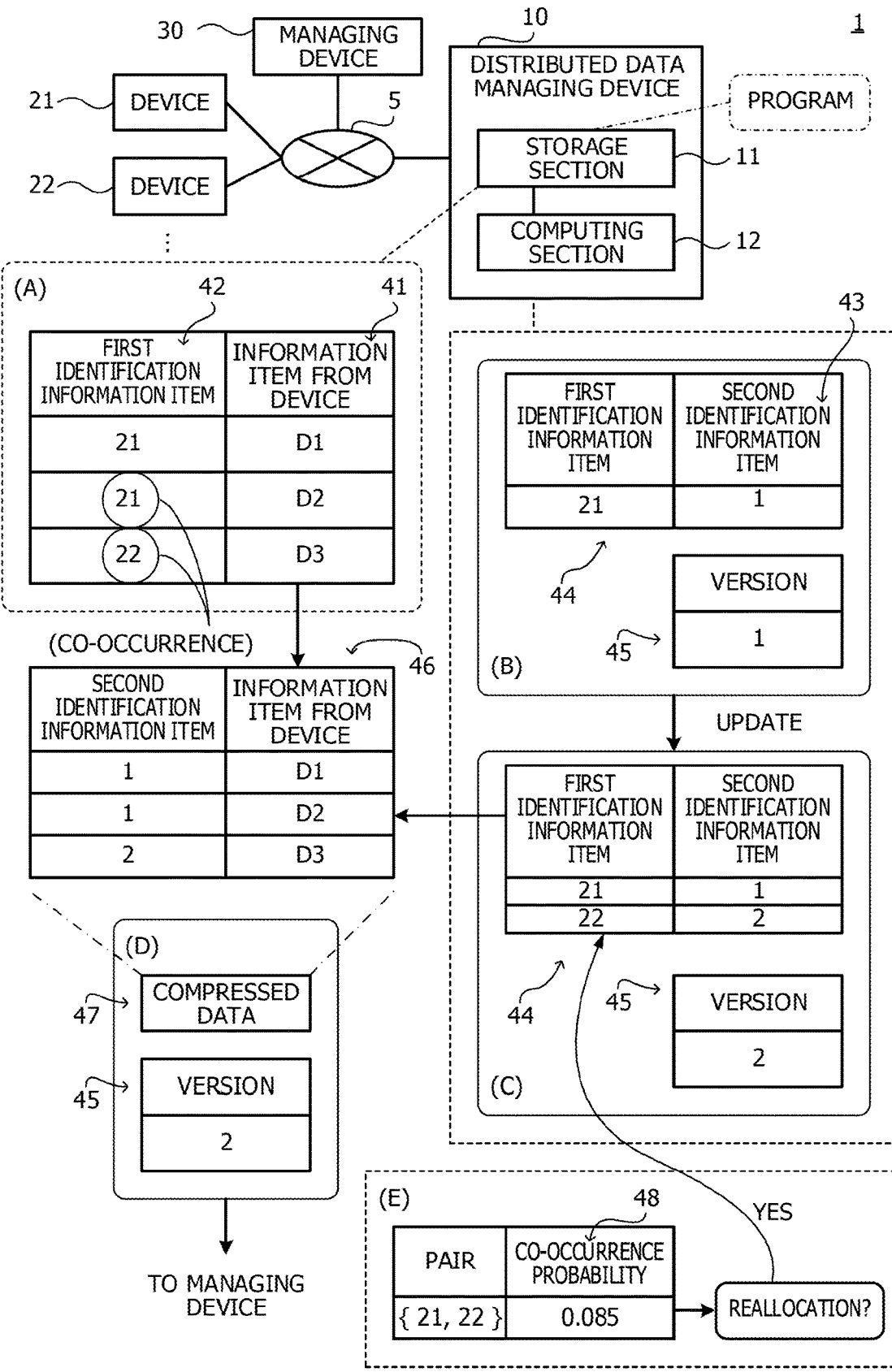
FIG. 1 is a diagram illustrating an example of a data management system according to a first embodiment.

A first embodiment is described with reference to FIG. 1. The first embodiment is related to a method for efficiently compressing information to be transmitted to a managing device. FIG. 1 is a diagram illustrating an example of a data management system according to the first embodiment.

As illustrated in FIG. 1, a data management system 1 includes a distributed data managing device 10, devices 21, 22, . . . , and a managing device 30. The distributed data managing device 10, the devices 21, 22, . . . , and the managing device 30 are connected to each other via a network 5. The network 5 is, for example, a LAN, a WAN, or the like and is composed of one or more of wired and wireless communication lines. The distributed data managing device 10 and the devices 21, 22, . . . are, for example, computers such as PCs, smartphones, in-vehicle devices, or the like. The managing device 30 is, for example, a computer that functions as a data center and is a PC, a server device, or the like.

The distributed data managing device 10 includes a storage section 11 and a computing section 12.

The storage section 11 is a volatile storage device such as a random access memory (RAM) or a nonvolatile storage device such as a hard disk drive (HDD) or a flash memory. The computing section 12 is a processor such as a central processing unit (CPU), a digital signal processor (DSP), an application specific integrated circuit (ASIC), or a field programmable gate array (FPGA). The computing section 12 executes a program stored in the storage section 11 or another memory, for example.

In the storage section 11, information items (information items 41 from the devices) acquired from the devices 21, 22, . . . are stored. An example of the information items 41 (also referred to as device information items 41) from the devices is sensor data output from sensors installed in the devices 21, 22, . . . .

In the example illustrated in FIG. 1, as indicated by (A), information items D1 and D2 from the device 21 and an information item D3 from the device 22 are stored in the storage section 11. The devices 21, 22, . . . are identified by first identification information items 42. In other words, the device information items 41 (D1 and D2) from the device 21 are associated with the first identification information item 42 identifying the device 21. The device information item 41 (D3) from the device 22 is associated with the first identification information item 42 identifying the device 22. The first identification information items 42 are, for example, IDs randomly selected from a wide namespace such as UUID v4.

In the storage section 11, an association table 44 in which the aforementioned first identification information items 42 and second identification information items 43 assigned to the first identification information items 42 are associated with each other, and version information 45 indicating a version of the association table 44, are stored (refer to (B) illustrated in FIG. 1). In other words, the association table 44 stored in the storage section 11 may include association information indicating association relationships between the first identification information items 42 and the second identification information items 43, and the version information 45 indicating the version of the association table 44.

The computing section 12 causes the device information items 41 (also referred to as information items 41 from the devices) acquired in a predetermined time period to be stored in the storage section 11 and determines whether or not the first identification information items 42 associated with the device information items 41 stored in the storage section 11 are already registered in the association table 44. For example, if the first identification information items 42 associated with the device information items 41 do not exist in the association table 44, the computing section 12 may determine that the first identification information items 42 are not registered in the association table 44. If the first identification information items 42 associated with the device information items 41 are not registered in the association table 44, the computing section 12 assigns new second identification information items 43 to the first identification information items 42 and registers, in the association table 44, information indicating association relationships between the first identification information items 42 and the new second identification information items 43, thereby updating the association table 44 and updating the version information 45 (refer to (C) illustrated in FIG. 1).

The computing section 12 converts the first identification information items 42 associated with the device information items 41 to the second identification information items 43 in accordance with the association relationships indicated in the aforementioned association table 44. The computing section 12 uses the second identification information items 43 after the conversion to compress the device information items 41. For example, the computing section 12 converts the first identification information items 42 to the second identification information items 43 based on the association table 44 and generates compressed data 47 by compressing one or more data sets 46 that are information of combinations of the second identification information items 43 and the device information items 41 (refer to (D) illustrated in FIG. 1). Then, the computing section 12 transmits the compressed data 47 and the version information 45 to the managing device 30. In the example illustrated in FIG. 1, the compressed data 47 includes a data set of the device information items "D1" and "D2" associated with a second identification information item "1" and a data set of the device information item "D3" associated with a second identification information item "2". Specifically, a first identification information item "21" is converted to the second identification information item "1", and a first identification information item "22" is converted to the second identification information item "2". The computing section 12 may transmit the association table to the managing device 30 simultaneously with or at different time from the transmission of the compressed data 47.

The computing section 12 stores the first identification information items 42 associated with the device information items 41 to be simultaneously compressed to the compressed data 47. The computing section 12 may acquire the first identification information items 42 associated with the device information items 41 by converting the second identification information items 43 associated with the device information items 41 before the compression to the first identification information items 42 in accordance with the association table 44. In the example illustrated in FIG. 1, as indicated by (A), the device information items 41 on the devices 21 and 22 are simultaneously compressed to the compressed data 47. In other words, the compressed data 47 exemplified in FIG. 1 includes the device information item 41 on the device 21 and the device information item 41 on the device 22. In still other words, the first identification information item 42 on the device 21 and the first identification information item 42 on the device 22 co-occur as targets to be compressed to the compressed data 47. In this case, if the second identification information items are assigned so that the efficiency of compressing the first identification information item 42 on the device 21 and the first identification information item 42 on the device 22 is high, the assignment may contribute to a reduction in the amount of the compressed data 47. Thus, every time the computing section 12 according to the present embodiment generates compressed data 47, the computing section 12 calculates a co-occurrence probability 48 of a pair of first identification information items 42 for multiple device information items 41 to be compressed. In an example indicated by (E) in FIG. 1, a co-occurrence probability (also referred to as co-occurrence probability between the device 21 and the device 22) of "0.85" is calculated for a pair {21, 22} of the first identification information item "21" associated with the device information items "D1 and D2" to be compressed to the compressed data 47 and the first identification information item "22" associated with the device information item "D3" to be compressed to the compressed data 47. Then, the computing section 12 reassigns the second identification information items 43 based on the co-occurrence probability 48.

For example, if the co-occurrence probability 48 between the device 21 and the device 22 is larger than a predetermined threshold, the computing section 12 assigns second identification information items 43 to be more efficiently compressed to the first identification information item 42 on the device 21 and the first identification information item 42 on the device 22. As the compression method, integer sequence compression (may be referred to as "integer compression") may be used, for example. The integer compression is an example of a compression algorithm (may be referred to as "coding algorithm") for a sequence of integers. In the integer compression, as the difference between a pair of integers to be compressed is smaller, the compression efficiency is higher. In other words, as the difference between a pair of integers to be compressed is smaller, the compressed data by the integer compression is smaller in size. If the integer sequence compression is used as the compression method, the computing section 12 assigns a pair of second identification information items 43 between which the difference is small to the first identification information item 42 on the device 21 and the first identification information item 42 on the device 22.

As described above, the efficiency of compressing information to be transmitted to the managing device 30 may be increased by assigning a pair of second identification information items 43 compressed at a high rate to a pair of first identification information items 42 likely to be simultaneously compressed. In addition, even if a combination of devices from which information is acquired is changed, a state in which a combination of second identification information items 43 compressed at a high rate is assigned to first identification information items 42 may be maintained by calculating a co-occurrence probability every time compression is executed and by executing the aforementioned reassignment.

The first embodiment is described above.

2. Second Embodiment

Next, a second embodiment is described. The second embodiment is related to a data management system in which data is accumulated in GW devices and directory information to be used to search data accumulated in the GW devices is compressed and transmitted to a data center.

[2-1. System]

Figure 2:
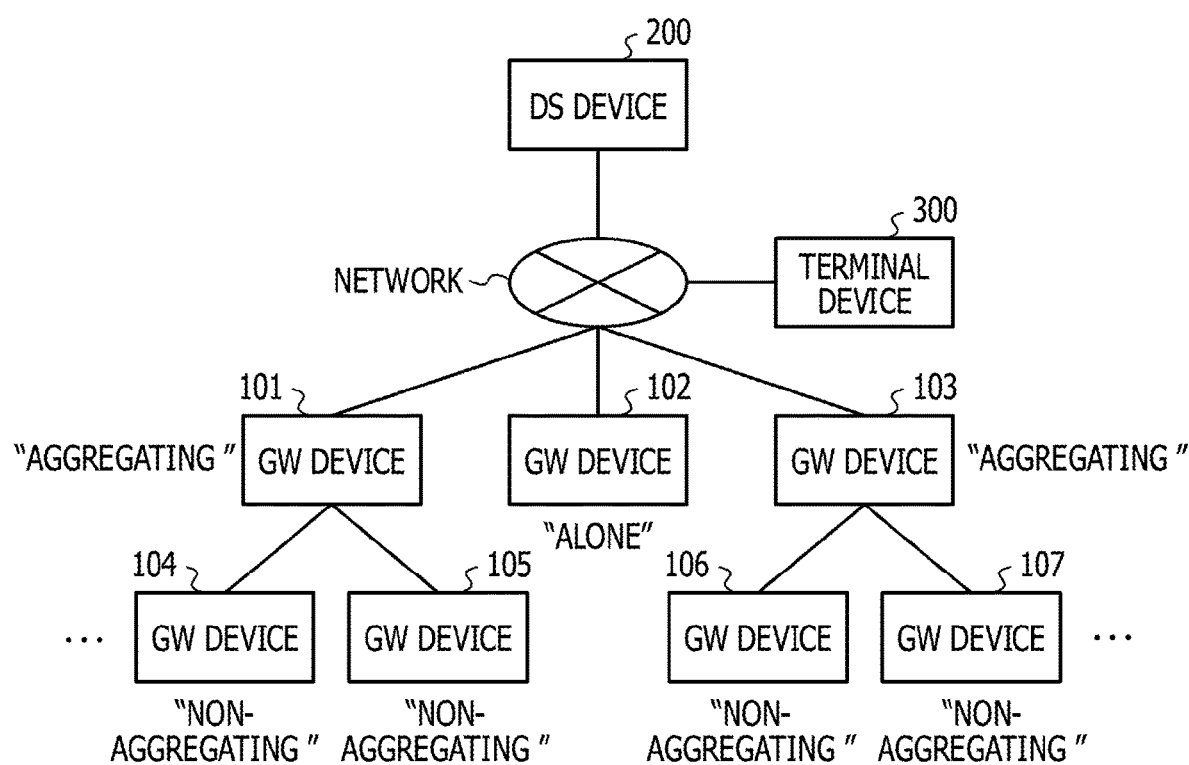
FIG. 2 is a diagram illustrating an example of a data management system according to a second embodiment.

A data management system 50 is described with reference to FIG. 2. FIG. 2 is a diagram illustrating an example of the data management system according to the second embodiment. The data management system 50 illustrated in FIG. 2 is an example of the data management system according to the second embodiment.

As illustrated in FIG. 2, the data management system 50 includes GW devices 101, 102, 103, 104, 105, 106, and 107, a directory service (DS) device 200, and a terminal device 300.

The GW devices 101, 102, 103, 104, 105, 106, and 107 are, for example, IoT devices that are PCs, smartphones, in-vehicle devices, or the like and include sensors that output data. Although the seven GW devices are illustrated in FIG. 2, the number of GW devices may be 6 or less or 8 or more.

Hereinafter, the GW devices 101 and 103 are referred to as aggregating GWs for convenience of description in some cases. In addition, the GW devices 104, 105, 106, and 107 are referred to as non-aggregating GWs in some cases. The aggregating GWs are the GW devices that aggregate and manage directory information on data accumulated in the non-aggregating GWs. For example, the non-aggregating GWs use short-range low-power-consumption wireless communication such as Bluetooth (registered trademark) Low Energy (BLE) to transmit the directory information to the aggregating GWs. The GW device 102 operates in the same manner as the GW device 104 and the like.

The DS device 200 is a computer that functions as a data center and is a PC, a server device, or the like. The DS device 200 provides a directory service for managing directory information to be used to search data accumulated in the GW devices 101, 102, 103, 104, 105, 106, and 107.

The terminal device 300 is a computer such as a PC or a smartphone. The terminal device 300 is a user terminal that is configured to search data accumulated in the GW devices 101, 102, 103, 104, 105, 106, and 107 and is used by a user.

(Acquisition of Data)

Figure 3:
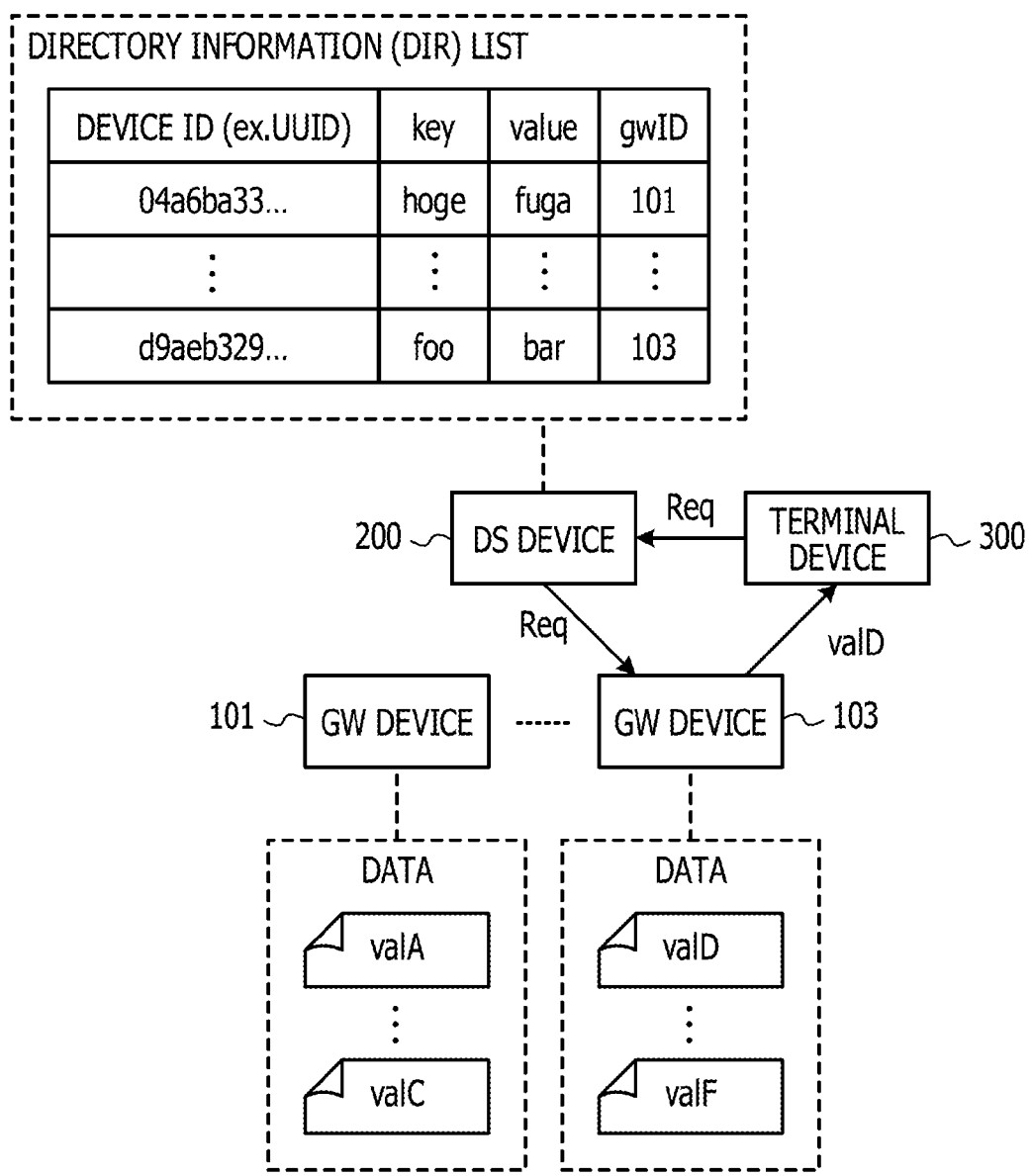
FIG. 3 is a diagram describing the acquisition of data.

A method for acquiring data included in the GW devices 101, 102, and 103 using the terminal device 300 is described with reference to FIG. 3. FIG. 3 is a diagram describing the acquisition of the data.

In an example illustrated in FIG. 3, data valA, . . . , and valC is accumulated in the GW device 101, and data valD, . . . , and valF is accumulated in the GW device 103. In this example, the DS device 200 holds directory information DIR to be used to search data accumulated in the GW devices 101, . . . , and 103. The directory information DIR includes device IDs (for example, UUIDs) to be used to identify the devices holding the data, attribute information (keys and values) to be used as key information for the data search, and gwIDs (GW IDs) to be used to identify the aggregating GWs. In other words, directory information DIR on the aggregating GW device 101 indicates logical positions at which data (also referred to as device information items) held in the GW devices (104, 105, and the like) that are the other computers exists. For example, since device IDs included in the directory information DIR are used to identify the devices holding the data, the directory information DIR serves as information indicating the logical positions at which the data exists.

For example, when a data acquisition request Req that specifies attribute information of the data valD included in the GW device 103 is input to the DS device 200, the DS device 200 references the directory information DIR and identifies the GW device 103. Then, the DS device 200 transmits, to the GW device 103, the data acquisition request Req specifying the attribute information of the data valD and a destination (terminal device 300) of the data. The GW device 103 identifies (selects) the data valD in response to the data acquisition request Req and transmits the data valD to the terminal device 300.

(Collection of Directory Information)

Figure 4:
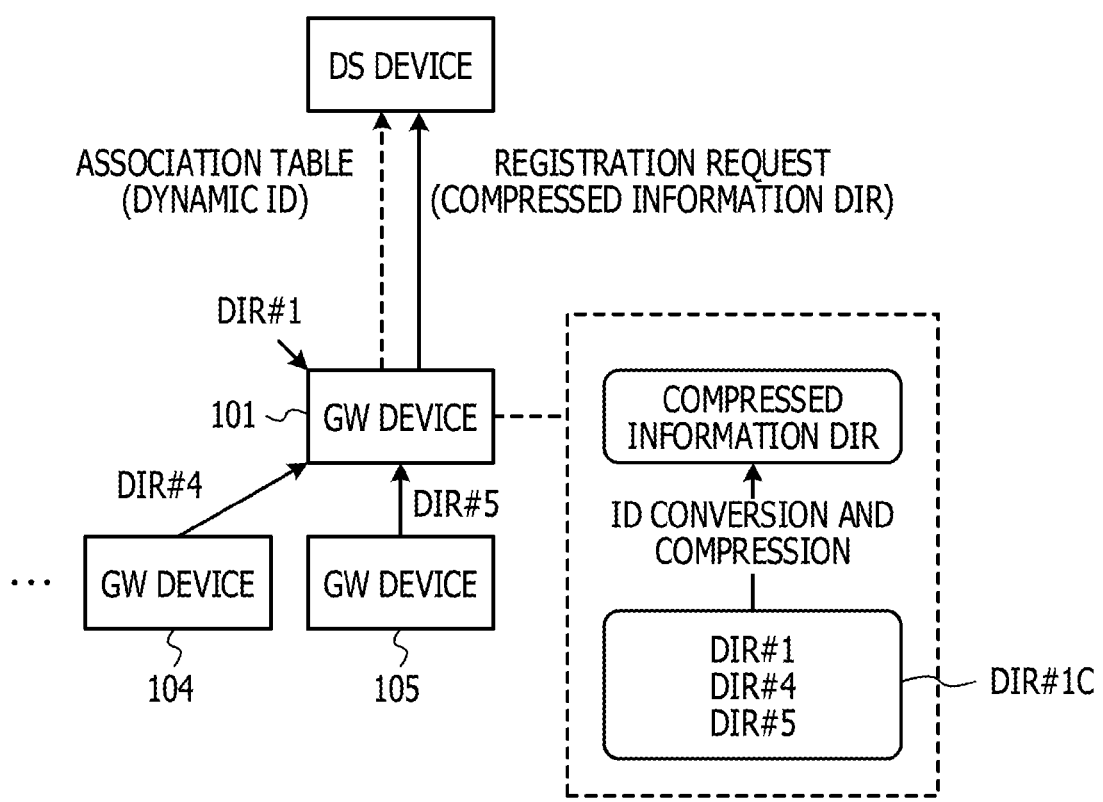
FIG. 4 is a diagram describing the collection of directory information.

In order to achieve the aforementioned mechanism, the DS device 200 uses a method illustrated in FIG. 4 to collect the directory information DIR from the aggregating GWs. FIG. 4 is a diagram describing the collection of the directory information. FIG. 4 exemplifies the case where the GW device 101 transmits the directory information DIR to the DS device 200 for convenience of description.

As illustrated in FIG. 4, the GW device 101 collects directory information DIR #4 and DIR #5 from the GW devices 104 and 105 that are the non-aggregating GWs. The directory information DIR #4 is directory information to be used to search data accumulated in the GW device 104. The directory information DIR #5 is directory information to be used to search data accumulated in the GW device 105.

The GW device 101 aggregates the directory information DIR #1 to be used to search data accumulated in the GW device 101 and the directory information DIR #4 and DIR #5 collected from the GW devices 104 and 105 to generate directory information DIR #1C.

In addition, the GW device 101 executes ID conversion on the device IDs included in the directory information DIR #1C and compresses the directory information DIR #1C after the ID conversion to generate compressed directory information (compressed information DIR). In other words, the compressed information DIR includes data of the directory information DIR #1C compressed after the ID conversion. The aforementioned ID conversion is executed based on an association table in which the device IDs are associated with dynamic IDs set in advance. The dynamic IDs are IDs set so that the rate of compressing the directory information DIR #1C is high.

The aforementioned compressed information DIR is transmitted from the GW device 101 to the DS device 200. In addition, the aforementioned association table in which the device IDs (also referred to as first identification information items) are associated with the dynamic IDs (also referred to as second identification information items) is transmitted from the GW device 101 to the DS device 200 simultaneously with or at different time from the transmission of the aforementioned compressed information DIR. For example, when the association table is updated, the association table after the update is transmitted from the GW device 101 to the DS device 200. The DS device 200 loads the compressed information DIR and uses the aforementioned association table to convert the dynamic IDs to the device IDs, thereby restoring the original directory information DIR #1C.

In the case where the directory information DIR #1C including the device IDs randomly selected from the wide namespace such as UUID v4 is compressed, an effect of the compression may be low depending on combinations of the device IDs. On the other hand, by executing the aforementioned ID conversion, the compression efficiency may be stably increased and a communication load caused by the transmission of the directory information DIR #1C may be reduced.

As the number of device IDs to be simultaneously compressed is increased, the compression efficiency is improved. In the aforementioned example, therefore, the aggregating GWs aggregate directory information of the non-aggregating GWs. The compression efficiency, however, is improved by the aforementioned ID conversion without the execution of the aforementioned aggregation. For example, the efficiency of compressing the directory information may be improved by applying the aforementioned ID conversion to the GW device 102 that does not aggregate the directory information of the non-aggregating GWs.

Hardware and functions of the GW device 101 and the like are described below, and the ID conversion and compression of the directory information, the update of the association table, and the like are further described below.

[2-2. Hardware]

Figure 5:
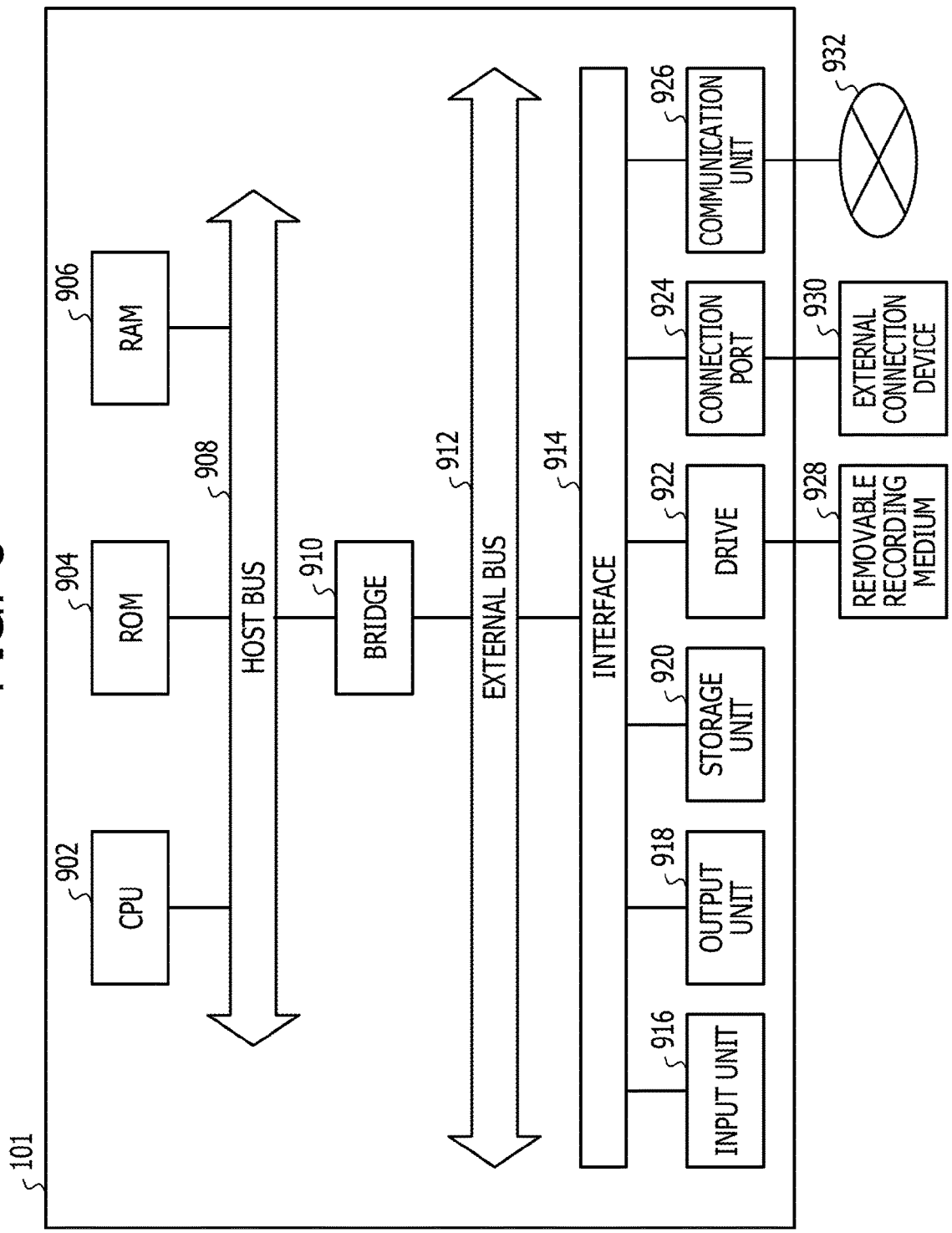
FIG. 5 is a block diagram illustrating an example of hardware that achieves functions of a GW device.

First, the hardware of the GW device 101 is described with reference to FIG. 5. FIG. 5 is a block diagram illustrating an example of the hardware that achieves the functions of the GW device.

The functions included in the GW device 101 may be achieved using hardware resources of an information processing device illustrated in FIG. 5, for example. Specifically, the functions included in the GW device 101 are achieved by using a computer program to control the hardware illustrated in FIG. 5.

As illustrated in FIG. 5, the hardware mainly includes a CPU 902, a read only memory (ROM) 904, a RAM 906, a host bus 908, and a bridge 910. The hardware further includes an external bus 912, an interface 914, an input unit 916, an output unit 918, a storage unit 920, a drive 922, a connection port 924, and a communication unit 926.

The CPU 902 functions as an arithmetic processing device or a control device and controls all or a part of operations of the constituent elements based on various programs stored in the ROM 904, the RAM 906, the storage unit 920, or a removable recording medium 928. The ROM 904 is an example of a storage device that stores a program to be read by the CPU 902, data to be used for computation, and the like. In the RAM 906, the program to be read into the CPU 902, parameters that change upon the execution of the program, and the like are temporarily or permanently stored, for example.

These elements are connected to each other via the host bus 908 that enables high-speed data transmission. The host bus 908 is connected via the bridge 910 to the external bus 912 whose data transmission rate is relatively low. As the input unit 916, a touch panel, a touch pad, a button, a switch, or the like is used, for example. As the output unit 918, a display device such as a liquid crystal display (LCD) or an electro-luminescence display (ELD) is used, for example.

The storage unit 920 is a device for storing various types of data. As the storage unit 920, a magnetic storage device such as an HDD is used, for example. Alternatively, as the storage unit 920, a semiconductor storage device such as a solid state drive (SSD) or a RAM disk, an optical storage device, a magneto-optical storage device, or the like may be used.

The drive 922 is a device configured to read information stored in the removable recording medium 928 that is a detachable recording medium or write information to the removable recording medium 928. As the removable recording medium 928, a magnetic disk, an optical disc, a magneto-optical disc, a semiconductor memory, or the like is used, for example.

The connection port 924 is, for example, a Universal Serial Bus (USB) port, an IEEE1394 port, or the like and is connected to an external connection device 930. As the external connection device 930, a memory reader, an auxiliary battery, various sensors, or the like may be used, for example.

The communication unit 926 is a communication device that is connected to a network 932. As the communication unit 926, a communication circuit for a wired or wireless LAN, a communication circuit for a wireless USB (WUSB), a communication circuit for BLE, a communication circuit for a mobile phone network, or the like is used, for example. The network 932 connected to the communication unit 926 is a wired or wireless connected network and includes, for example, the Internet, a LAN, a mobile phone line, and the like.

Functions of the GW devices 102, 103, 104, 105, 106, and 107, functions of the DS device 200, and functions of the terminal device 300 may be achieved by the hardware illustrated in FIG. 5.

[2-3. Functions]

Next, the functions of the GW device 101 and the functions of the DS device 200 are described. The GW devices 102 and 103 have substantially the same functions (functions of the aggregating GWs) as those of the GW device 101. Thus, a detailed description of the functions of the GW devices 102 and 103 is omitted.

(GW Device)

Figure 6:
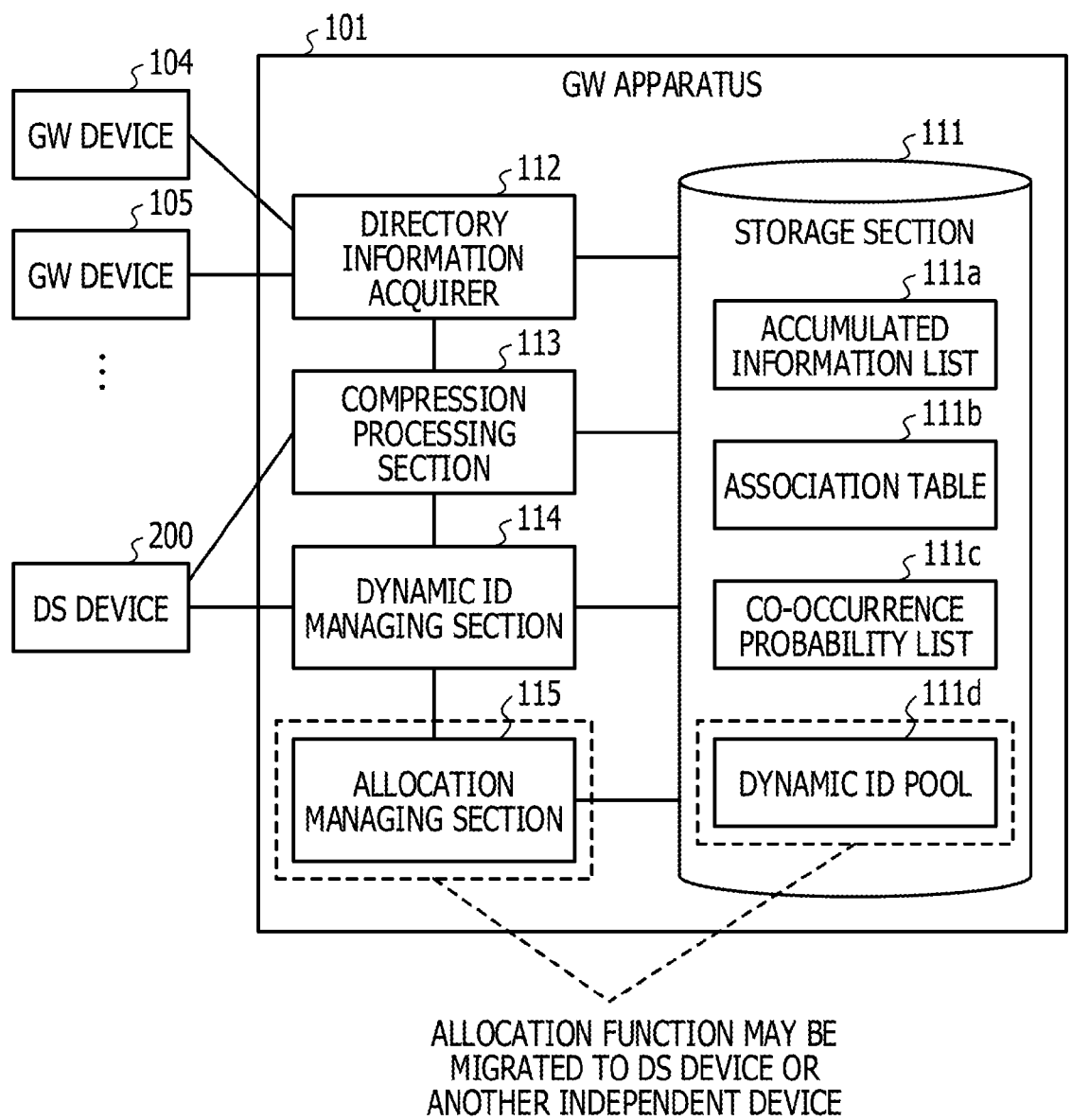
FIG. 6 is a block diagram illustrating an example of the functions included in the GW device according to the second embodiment.

First, the functions of the GW device 101 are described with reference to FIG. 6. FIG. 6 is a block diagram illustrating an example of the functions included in the GW device 101 according to the second embodiment.

As illustrated in FIG. 6, the GW device 101 includes a storage section 111, a directory information acquirer 112, a compression processing section 113, a dynamic ID managing section 114, and an allocation managing section 115. Functions of the storage section 111 may be achieved using the aforementioned RAM 906, the aforementioned storage unit 920, and the like. Functions of the directory information acquirer 112, functions of the compression processing section 113, functions of the dynamic ID managing section 114, and functions of the allocation managing section 115 may be achieved mainly using the aforementioned CPU 902 or the like.

In the storage section 111, an accumulated information list 111a, an association table 111b, a co-occurrence probability list 111c, and a dynamic ID pool 111d are stored.

The accumulated information list 111a is a set of the directory information DIR accumulated in the GW device 101. The accumulated information list 111a includes, for example, the directory information DIR (DIR #1) on data to be output by the GW device 101 and the directory information DIR (DIR #4, DIR #5, and the like) acquired from the GW devices 104, 105, and the like that are the non-aggregating GWs.

Figure 7:
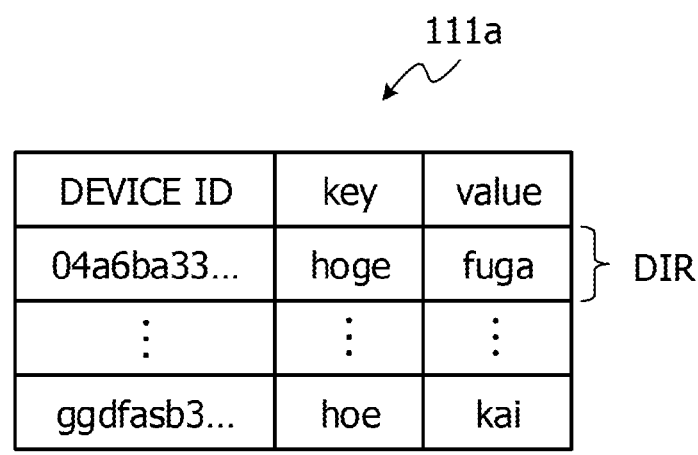
FIG. 7 is a diagram illustrating an example of an accumulated information list.

For example, the accumulated information list 111a includes details illustrated in FIG. 7. FIG. 7 is a diagram illustrating an example of the accumulated information list. In the example illustrated in FIG. 7, a set of directory information DIR including device IDs and attribute information (keys and values) to be used to search data is included in the accumulated information list 111a. The device IDs are identification information of devices (for example, the GW devices 101, 104, 105, and the like) holding data. The device IDs are expressed by IDs randomly selected from the namespace such as UUID v4, for example. In this case, each of the device IDs is a 16-byte bit sequence.

The association table 111b is information in which the device IDs are associated with dynamic IDs. The dynamic IDs are provided by a function of the allocation managing device 115 described later. The association table 111b is used for the ID conversion executed before the compression of the directory information DIR. For example, the association table 111b includes details illustrated in FIG. 8. FIG. 8 is a diagram illustrating an example of the association table. In the example illustrated in FIG. 8, device IDs, dynamic IDs, and version information (Ver.) of the association table 111b are included in the association table 111b. The version of the association table 111b is updated every time the association table 111b is updated. The version information may be managed separately from the association table 111b.

Figure 9:
FIG. 9 is a diagram illustrating an example of a co-occurrence probability list.

The co-occurrence probability list 111c is a list of probabilities (co-occurrence probabilities) with which pairs (device ID pairs) of specific device IDs are included in a set of directory information DIR to be simultaneously compressed. For example, the co-occurrence probability list 111c includes details illustrated in FIG. 9. FIG. 9 is a diagram illustrating an example of the co-occurrence probability list. In the example illustrated in FIG. 9, pairs of device IDs and co-occurrence probabilities associated with the pairs of device IDs are included in the co-occurrence probability list 111c. The co-occurrence probabilities are updated every time when compression is executed. In addition, the co-occurrence probability list 111c is referenced when the association table 111b is updated.

Figure 10:
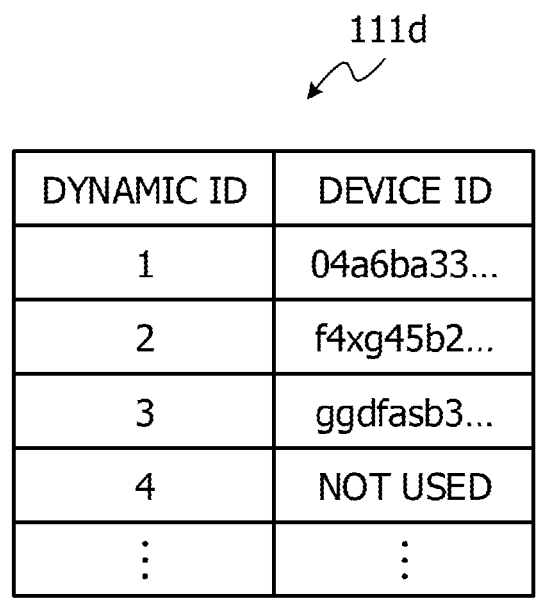
FIG. 10 is a diagram illustrating an example of a dynamic ID pool.

The dynamic ID pool 111d is information indicating a list of dynamic IDs set in advance and usage states of the dynamic IDs. For example, the dynamic ID pool 111d includes details illustrated in FIG. 10. FIG. 10 is a diagram illustrating an example of the dynamic ID pool. In the example illustrated in FIG. 10, allocated dynamic IDs are associated with device IDs corresponding to the dynamic IDs, and unallocated dynamic IDs are associated with "not used" indicating that the dynamic IDs are not allocated. The dynamic ID pool 111d is referenced when a dynamic ID is allocated.

Refer to FIG. 6 again. The directory information acquirer 112 acquires directory information DIR from the non-aggregating GWs (for example, the GW devices 104 and 105) and adds the acquired directory information DIR to the accumulated information list 111a. In addition, the directory information acquirer 112 generates directory information DIR on data held in the GW device 101 and adds the generated directory information DIR to the accumulated information list 111a.

The compression processing section 113 executes, based on the association table 111b, the ID conversion to convert device IDs (also referred to as first identification information items) of the directory information DIR included in the accumulated information list 111a to dynamic IDs (also referred to as second identification information items). In addition, the compression processing section 113 compresses the directory information DIR after the ID conversion. As the compression method, integer sequence compression to be executed to calculate differences between adjacent integers of an integer sequence and reduce the length of a bit sequence indicating the differences, or the like, may be applied. The integer sequence compression is described later. A compression method other than the integer sequence compression may be applied. In addition, the compression processing section 113 transmits the compressed directory information DIR to the DS device 200.

The dynamic ID managing section 114 manages the association table 111b. For example, when the dynamic ID managing section 114 is requested by the DS device 200 to provide the association table 111b, the dynamic ID managing section 114 transmits the association table 111b including the version information to the DS device 200. In addition, the dynamic ID managing section 114 calculates the aforementioned co-occurrence probabilities and updates the co-occurrence probability list 111c every time the directory information DIR is compressed by the compression processing section 113. In addition, the dynamic ID managing section 114 uses the co-occurrence probability list 111c to update the association table 111b.

When the allocation managing section 115 receives a request to allocate a dynamic ID from the dynamic ID managing section 114, the allocation managing section 115 references the dynamic ID pool 111d, selects the dynamic ID appropriate for the allocation request, and returns a response to the allocation request. For convenience of description, a process of extracting, from the dynamic ID pool 111d, a dynamic ID as a dynamic ID to be associated with a device ID is referred to as "allocation" (also referred to as "assignment"). For example, the allocation managing section 115 executes processes of releasing an allocated dynamic ID among dynamic IDs included in the dynamic ID pool 111d, allocating an unallocated dynamic ID among the dynamic IDs included in the dynamic ID pool 111d, and the like.

As a modified example, the functions of the allocation managing section 115 may be installed in the DS device 200. In this case, the dynamic ID pool 111d stored in the storage section 111 is held in the DS device 200. Alternatively, the functions of the allocation managing section 115 may be installed in another independent device different from the GW device 101 and the DS device 200. In this case, the dynamic ID pool 111d stored in the storage section 111 is held in the other independent device. The modified example belongs to a technical range of the second embodiment.

The GW device 101 includes the aforementioned functions.

(DS Device)

Figure 11:
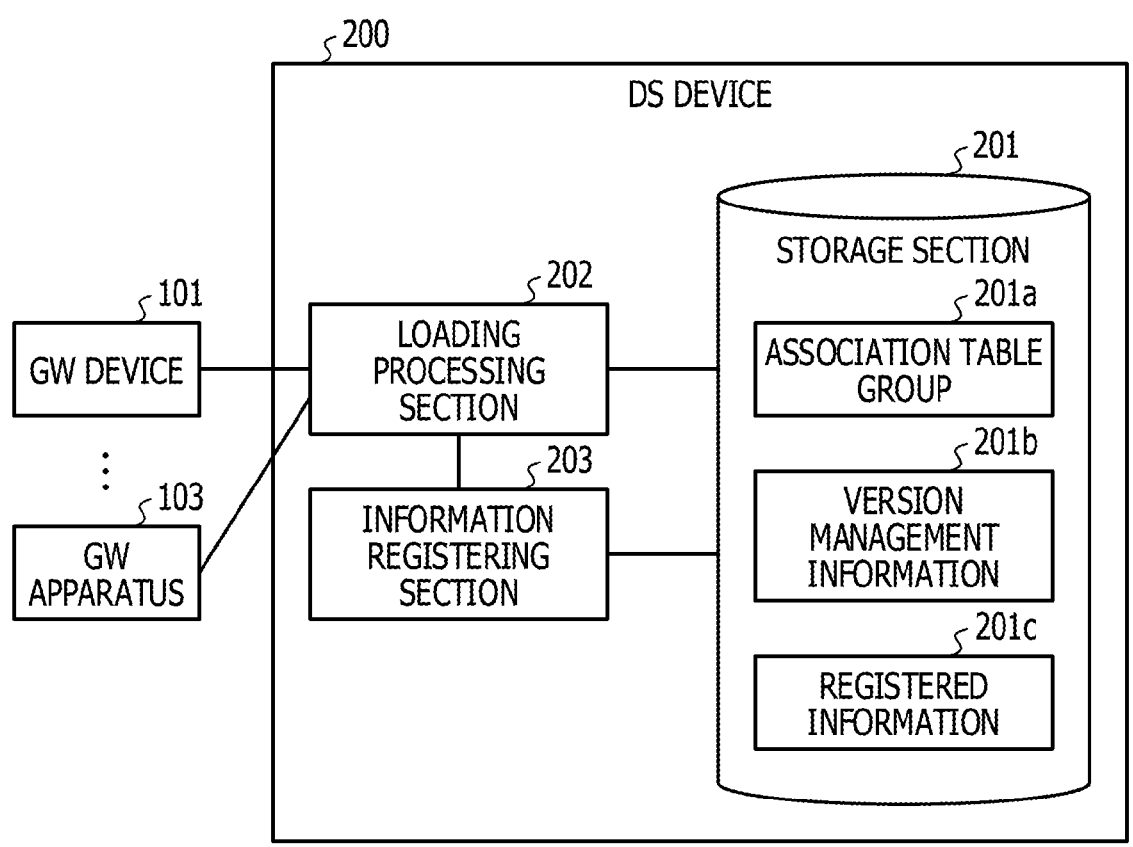
FIG. 11 is a block diagram illustrating an example of functions included in a DS device according to the second embodiment.

Next, the functions of the DS device 200 are described with reference to FIG. 11. FIG. 11 is a block diagram illustrating an example of the functions included in the DS device according to the second embodiment.

As illustrated in FIG. 11, the DS device 200 includes a storage section 201, a loading processing section 202, and an information registering section 203. Functions of the storage section 201 may be achieved using hardware resources corresponding to the aforementioned RAM 906, the storage section 920, and the like. Functions of the loading processing section 202 and functions of the information registering section 203 may be achieved mainly using a hardware resource corresponding to the aforementioned CPU 902 or the like.

In the storage section 201, an association table group 201a, version management information 201b, and registered information 201c are stored.

The association table group 201a is a set of association tables (corresponding to the association table 111b) acquired from the aggregating GWs (for example, the GW devices 101, . . . , and 103). For example, the association table group 201a includes details illustrated in FIG. 12. FIG. 12 is a diagram illustrating an example of the association table group.

In the example illustrated in FIG. 12, an association table #1 (corresponding to the association table 111b) acquired from the GW device 101, . . . , and an association table #3 acquired from the GW device 103 are included in the association table group 201a. The association table #1 includes gwID "101" identifying the GW device 101. Similarly, the association table #3 includes gwID "103" identifying the GW device 103. Version information may be added to each of the association tables #1, . . . , and #3.

Figure 13:
FIG. 13 is a diagram illustrating an example of version management information.

The version management information 201b is information to be used to manage versions of the association tables included in the association table group 201a. For example, the version management information 201b includes details illustrated in FIG. 13. FIG. 13 is a diagram illustrating an example of the version management information. In the example illustrated in FIG. 13, in the version management information 201b, gwID "101" corresponding to the association table #1 and version information (Ver.) of the association table #1 are associated with each other, and gwID "103" corresponding to the association table #3 and version information (Ver.) of the association table #3 are associated with each other.

Figure 14:
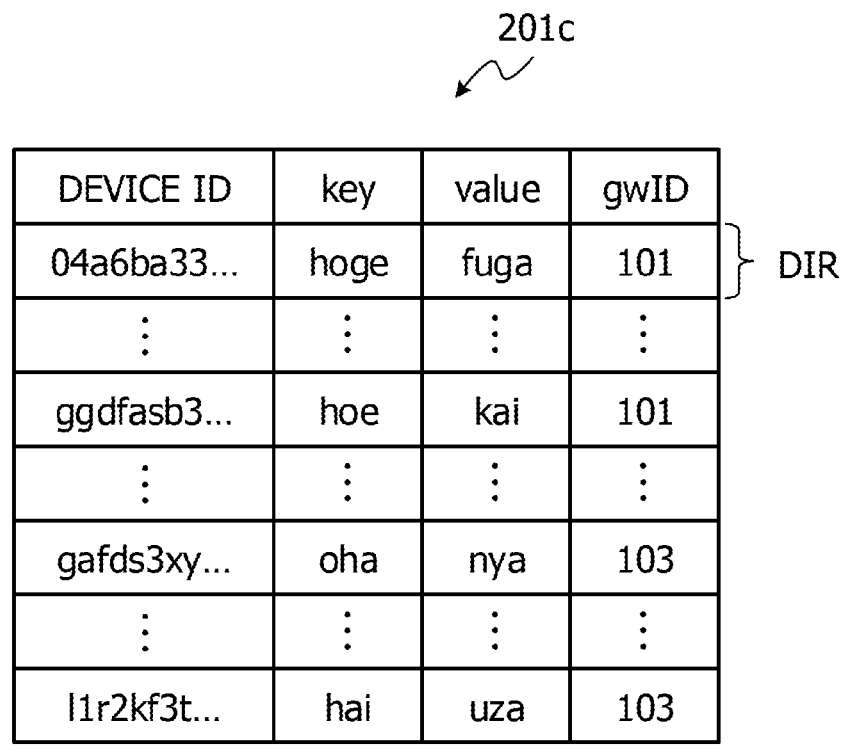
FIG. 14 is a diagram illustrating an example of registered information.

The registered information 201c is a set of the directory information DIR registered in the DS device 200. When a request to search data is transmitted from the terminal device 300 to the DS device 200, a location at which the data exists is searched based on the registered information 201c. For example, the registered information 201c includes details illustrated in FIG. 14. FIG. 14 is a diagram illustrating an example of the registered information. In the example illustrated in FIG. 14, directory information DIR including device IDs and attribute information (keys and values), and gwIDs of the aggregating GWs holding the directory information DIR are included in the registered information 201c.

Refer to FIG. 11 again. The loading processing section 202 loads the compressed directory information DIR acquired from the aggregating GWs and restores the directory information after the ID conversion. In addition, the loading processing section 202 references the association table group 201a, executes inverse ID conversion to convert dynamic IDs included in the directory information DIR after the ID conversion to the device IDs and restore the original directory information DIR. The information registering section 203 adds the original directory information DIR restored by the loading processing section 202 to the registered information 201c.

The DS device 200 has the aforementioned functions.

Figure 15:
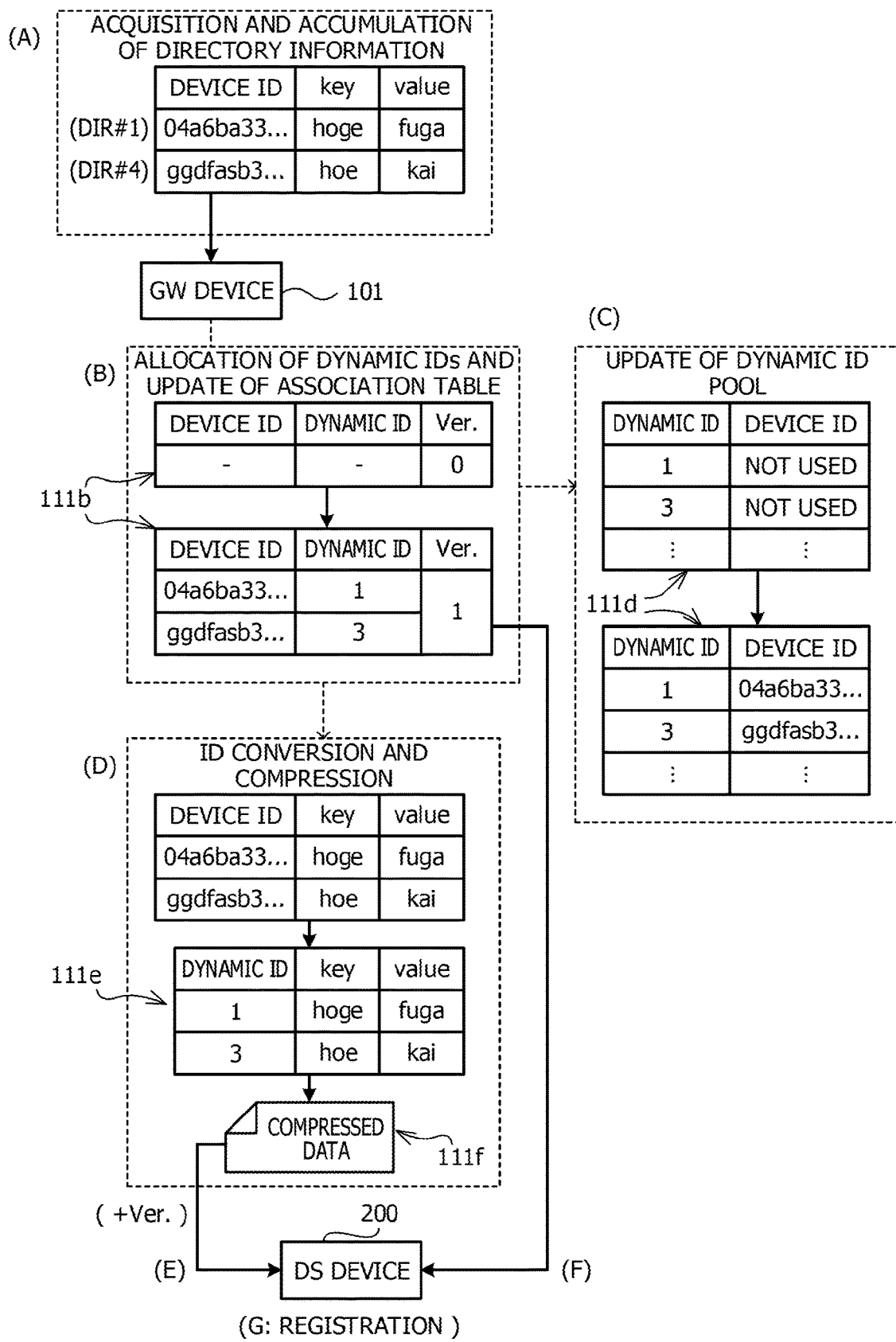
FIG. 15 is a diagram describing an example of operations (flow from a request to register directory information to the registration) of the GW device and the DS device.

Operational Example: Flow from Request to Register Directory Information to Registration A flow from a request to register the directory information to the registration is described with reference to FIG. 15. FIG. 15 is a diagram describing an example of operations (the flow from the request to register the directory information to the registration) of the GW device and the DS device.

If data is held in the GW devices 101 and 104 and the directory information DIR #1 and DIR #4 is added to the accumulated information list 111a as indicated by (A) in FIG. 15, the dynamic ID managing section 114 updates the association table 111b as indicated by (B) in FIG. 15. Specifically, in an example indicated by (A) in FIG. 15, the directory information DIR #1 including a device ID "04a6ba33 . . . " and the directory information DIR #4 including a device ID "ggdfasb3 . . . " are added to the accumulated information list 111a. In an example indicated by (B) in FIG. 15, a dynamic ID "1" associated with the device ID "04a6ba33 . . . " and a dynamic ID "3" associated with the device ID "ggdfasb3 . . . " are added to the association table 111b.

If a combination of a dynamic ID and a device ID matching a device ID included in directory information added to the accumulated information list 111a does not exist in the association table 111b before the update as indicated by (B) in FIG. 15, the dynamic ID managing section 114 issues, to the allocation managing section 115, a request to allocate the dynamic ID. The allocation managing section 115 references the dynamic ID pool 111d in response to the allocation request. If the dynamic ID associated with the device ID specified in the allocation request does not exist, the allocation managing section 115 allocates an unallocated dynamic ID to the device ID. If the dynamic ID associated with the device ID exists, the allocation managing section 115 allocates the dynamic ID to the device ID.

In the example illustrated in FIG. 15, the dynamic IDs "1" and "3" are allocated. The allocation managing section 115 updates the dynamic ID pool 111d so that the allocated dynamic IDs are associated with the device IDs to which the dynamic IDs are allocated, as indicated by (C) in FIG. 15. The dynamic ID managing section 114 updates the association table 111b so that the device IDs are associated with the dynamic IDs. In addition, the dynamic ID managing section 114 updates the version information of the association table 111b. In this example, the version of the association table 111b is updated from 0 to 1

The compression processing section 113 references the association table 111b, converts the device IDs of the directory information DIR #1 and DIR #4 to the dynamic IDs, and compresses directory information 111e after the ID conversion to generate compressed data 111f, as indicated by (D) in FIG. 15. In an example indicated by (D) in FIG. 15, the device ID "04a6ba33 . . . " of the directory information DIR #1 is converted to the dynamic ID "1", and the device ID "ddgfasb3 . . . " of the directory information DIR #4 is converted to the dynamic ID "3". Then, the compression processing section 113 transmits the compressed data 111f to the DS device 200, as indicated by (E) in FIG. 15. In this case, the compression processing section 113 transmits the version information (Ver.) of the association table 111b together with the compressed data 111f. In other words, the compressed data 111f transmitted to the DS device 200 may include the version information (Ver.) of the association table 111b.

The loading processing section 202 included in the DS device 200 determines whether or not version information (also referred to as first version information) associated with the GW device 101 and included in the version management information 201b stored in the storage section 201 of the DS device 200 matches the version information (also referred to as second version information) received together with the compressed data 111f. In the example illustrated in FIG. 15, since the version information does not match, the loading processing section 202 requests the GW device 101 to transmit the association table 111b and acquires the latest association table 111b, as indicated by (F) in FIG. 15. In other words, if the first version information does not match the second version information, the DS device 200 acquires the association table 111b matching the second version information from the GW device 101. In addition, the loading processing section 202 updates the association table group 201a based on the latest association table 111b and updates the version management information 201b.

The loading processing section 202 included in the DS device 200 loads the compressed data 111f and restores the directory information 111e after the ID conversion. In addition, the loading processing section 202 converts the dynamic IDs included in the directory information 111e after the ID conversion to the device IDs based on the association table group 201a after the update and restores the original directory information DIR #1 and DIR #4. The information registering section 203 adds the directory information DIR #1 and DIR #4 restored by the loading processing section 202 to the registered information 201c, as indicated by (G) in FIG. 15.

The directory information is registered in the aforementioned flow.

Operational Example: Integer sequence Compression

Figure 16:
FIG. 16 is a diagram describing integer sequence compression as an example of a compression process.

The integer sequence compression is described with reference to FIG. 16. FIG. 16 is a diagram describing the integer sequence compression as an example of a compression process. The integer sequence compression is an example of a compression method that is applicable to the compression of the directory information DIR, and the compression method that is applicable to techniques described in the second embodiment is not limited to the integer sequence compression.

As illustrated in FIG. 16, the integer sequence compression includes processes of Step. 1 and Step. 2.

<Step. 1> The process of Step. 1 includes a process of sorting integers of an integer sequence in ascending order (or descending order) and a process of calculating differences between the adjacent integers. For example, if an integer sequence {2, 12, 5, 10} is given, an integer sequence {2, 5, 10, 12} is obtained in the process of sorting in ascending order. In the process of calculating the differences, the difference between 5 and 2 is calculated to be "3", the difference between 10 and 5 is calculated to be "5", the difference between 12 and 10 is calculated to be "2", and an integer sequence {2, 3, 5, 2} is obtained.

<Step. 2> The process of Step. 2 includes a process of encoding a bit sequence indicating the integers of the integer sequence obtained in the process of Step. 1 to obtain a shorter bit sequence. A delimiter bit is used in the encoding. The delimiter bit is inserted at a specific bit position and indicates whether or not a bit more significant than the bit position indicates 1. For example, if the delimiter bit is inserted to the 9th bit, and the 9th bit value is "1", "1" appears in the 10th bit or later. If the delimiter bit is inserted to the 9th bit, and the 9th bit value is "0", "1" does not appear in the 10th bit or later.

If a bit sequence "0000000000000010" that is expressed by 16 bits and indicates an integer "2" is used as an example, the integer "2" is expressed by "000000010" using the delimiter bit. In this manner, a bit sequence of 16 bits may be reduced to a bit sequence of 9 bits using a compressed representation with the delimiter bit. According to this characteristic of the compressed representation, as an integer is smaller, a bit sequence to be expressed is shorter and the compression efficiency is higher. Thus, the process of Step. 1 is executed to reduce integers.

The compression method is not limited to the aforementioned integer sequence compression. As a method for compressing information expressed by a long bit sequence, there is a method for removing useless significant bits to reduce a bit length by introducing a mechanism such as a mechanism using a delimiter bit. If such a method is applied, a pre-process of processing information to be compressed like Step. 1 is effective to improve the compression efficiency.

If the compression is applied to the aforementioned process of compressing the directory information DIR, the compression efficiency may be improved by converting a combination of device IDs to be simultaneously compressed to appropriate dynamic IDs. On the other hand, in an environment in which a combination of device IDs to be simultaneously compressed dynamically changes, a stably high compression efficiency may be achieved by introducing a mechanism (reallocation) for appropriately updating a combination of dynamic IDs to be allocated to device IDs.

Operational Example: Determination of Reallocation

Figure 17:
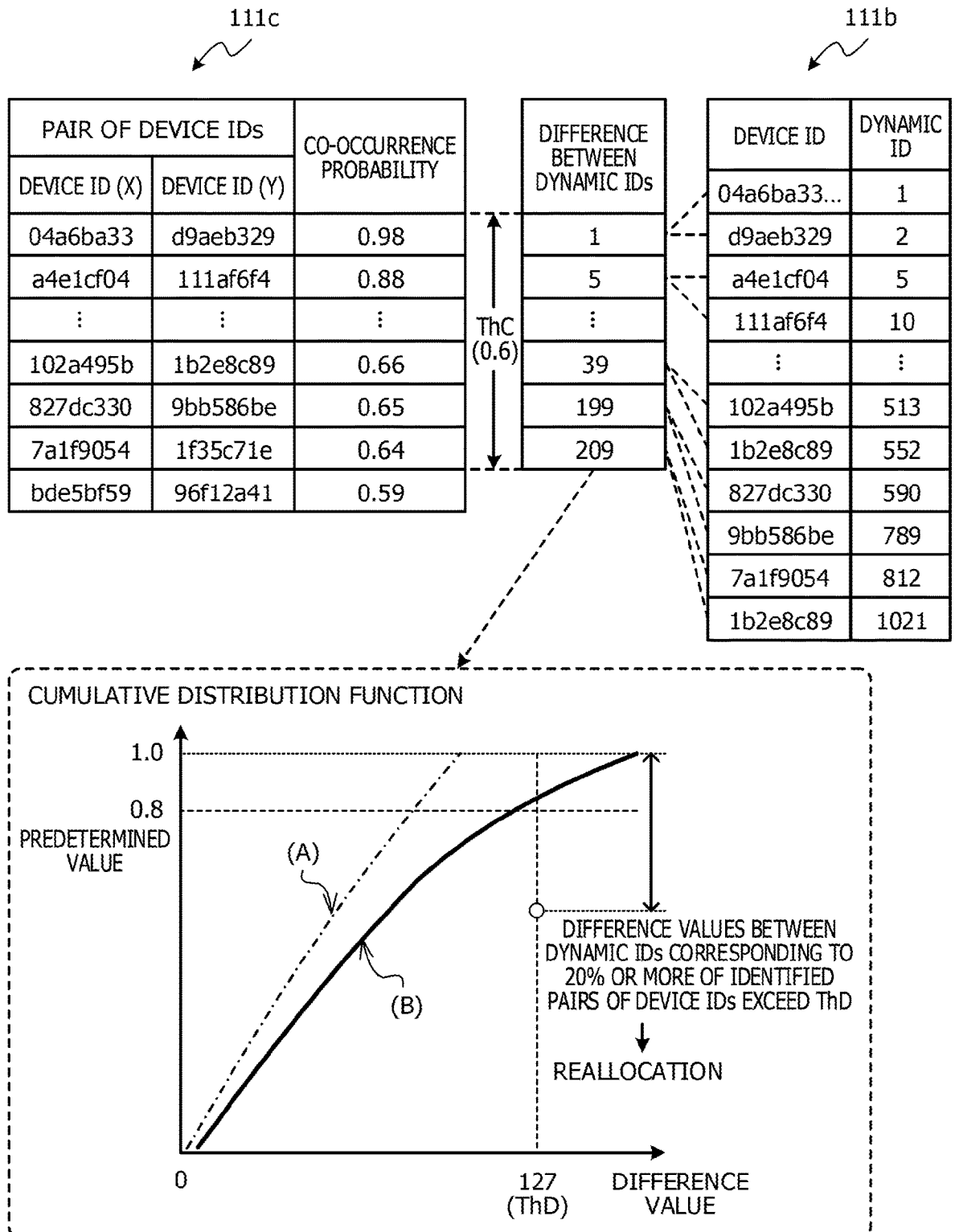
FIG. 17 is a diagram describing the determination of reallocation.

The aforementioned reallocation is described with reference to FIG. 17. FIG. 17 is a diagram describing the determination of the reallocation.

In the aforementioned integer sequence compression, as values of dynamic IDs to be simultaneously compressed are closer to each other, the compression efficiency is higher. Thus, the compression efficiency is expected to be maintained at a stably high level by identifying a pair of device IDs to be simultaneously compressed with a high probability (co-occurrence probability) and allocating dynamic IDs whose values are close to each other to the pair of device IDs. In addition, the compression efficiency is expected to be maintained at a stably high level by executing reallocation in the case where pairs of dynamic IDs between which differences are large are allocated to a large number of pairs of device IDs whose co-occurrence probabilities are high. In other words, the compression efficiency is expected to be stably high by reassigning dynamic IDs between which differences are small to a large number of pairs of device IDs whose co-occurrence probabilities are high.

For the aforementioned reasons, the dynamic ID managing section 114 included in the GW device 101 references the co-occurrence probability list 111c and identifies (selects) pairs of device IDs whose co-occurrence probabilities are larger than a threshold ThC (of, for example, 0.6) (also referred to as first threshold), as illustrated in FIG. 17. In addition, the dynamic ID managing section 114 references the association table 111b and calculates difference values (dynamic ID differences) between dynamic IDs for the identified (selected) pairs of device IDs.

In addition, the dynamic ID managing section 114 calculates a cumulative distribution function for the difference values. The cumulative distribution function indicates the ratio of the number of pairs of device IDs corresponding to differences, equal to or smaller than a certain difference value, between dynamic IDs with respect to a population (or the number of the identified pairs of device IDs). For example, if a number M of pairs of device IDs exist in the population, and a number m of pairs of device IDs corresponding to dynamic IDs between which difference values are equal to or smaller than Q exist, the value of the cumulative distribution function for the difference value Q is m/M.

The dynamic ID managing section 114 determines whether or not the value of the cumulative distribution function for a difference value ThD (of, for example, 127) is smaller than a predetermined value (of, for example, 0.8) (also referred to as second threshold). For example, in a graph (A) exemplified in FIG. 17, the value of the cumulative distribution function for the difference value ThD is equal to or larger than 0.8. In this case, difference values between dynamic IDs corresponding to pairs of device IDs, which are 80% or more of the identified pairs of device IDs, are equal to or smaller than ThD. Specifically, if the value of the cumulative distribution function is equal to or larger than the second threshold, appropriate combinations of dynamic IDs that cause the compression efficiency to be high are already allocated. In other words, as the value of the cumulative distribution function is higher, the degree of the assignment of combinations of dynamic IDs that cause the compression efficiency to be high is higher.

On the other hand, in a graph (B), the value of the cumulative distribution function for the difference value ThD is equal to or smaller than 0.8. In this case, difference values between dynamic IDs corresponding to pairs of device IDs, which are 20% or more of the identified pairs of device IDs, are neither equal to nor smaller than ThD. Specifically, pairs of device IDs to which appropriate combinations of dynamic IDs that cause the compression efficiency to be low have been allocated are 20% or more of the identified pairs of device IDs.

For the aforementioned reasons, if the value of the cumulative distribution function for the difference value ThD is neither equal to nor larger than the predetermined value (of, for example, 0.8), the dynamic ID managing section 114 requests the allocation managing section 115 to reallocate dynamic IDs to pairs of device IDs whose co-occurrence probabilities are larger than ThC. In other words, if the value of the cumulative distribution function for the difference value ThD is smaller than the second threshold, the dynamic ID managing section 114 requests the allocation managing section 115 to reallocate the dynamic IDs to the pairs of device IDs whose co-occurrence probabilities are larger than ThC. In addition, the dynamic ID managing section 114 uses the dynamic IDs allocated by the allocation managing section 115 to update the associate table 111b. Even if combinations of device IDs to be simultaneously compressed are dynamically changed, a stably high compression efficiency may be achieved by executing the aforementioned process.

The functions of the GW device 101 and the functions of the DS device 200 are described above.

[2-4. Flow of Process]

Next, the flow of a process to be executed by the GW process 101 and the DS device 200 is described. Each of the GW devices 102 and 103 executes a process (process to be executed by each of the aggregating GWs) in substantially the same manner as the GW device 101. Thus, a detailed description of the flow of the process to be executed by the GW devices 102 and 103 is omitted.

(Operations of GW Device)

First, the flow of a process to be executed by the GW device 101 is described with reference to FIGS. 18 to 21.

Figure 18:
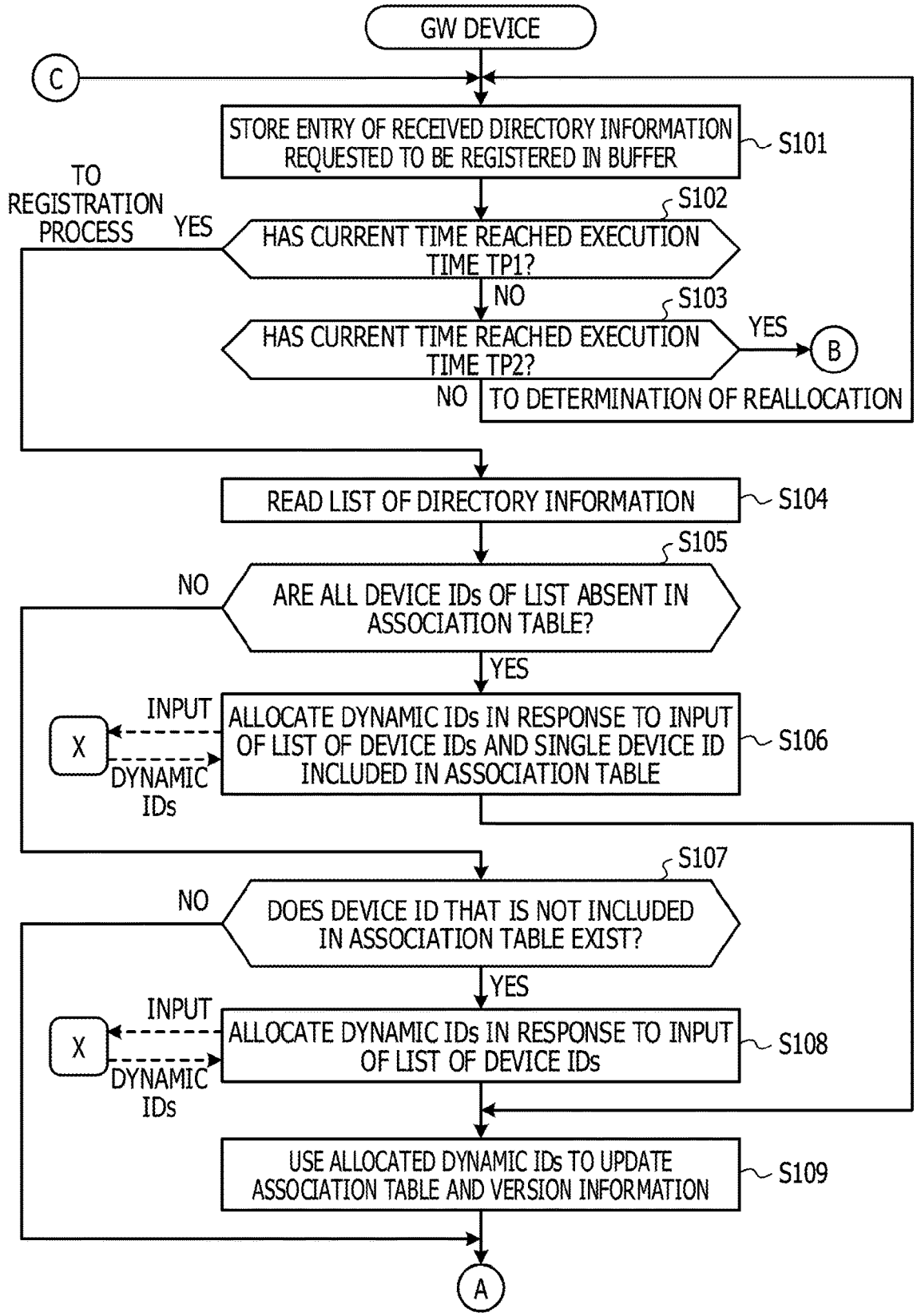
FIG. 18 is a first flow diagram describing operations of the GW device according to the second embodiment.
Figure 19:
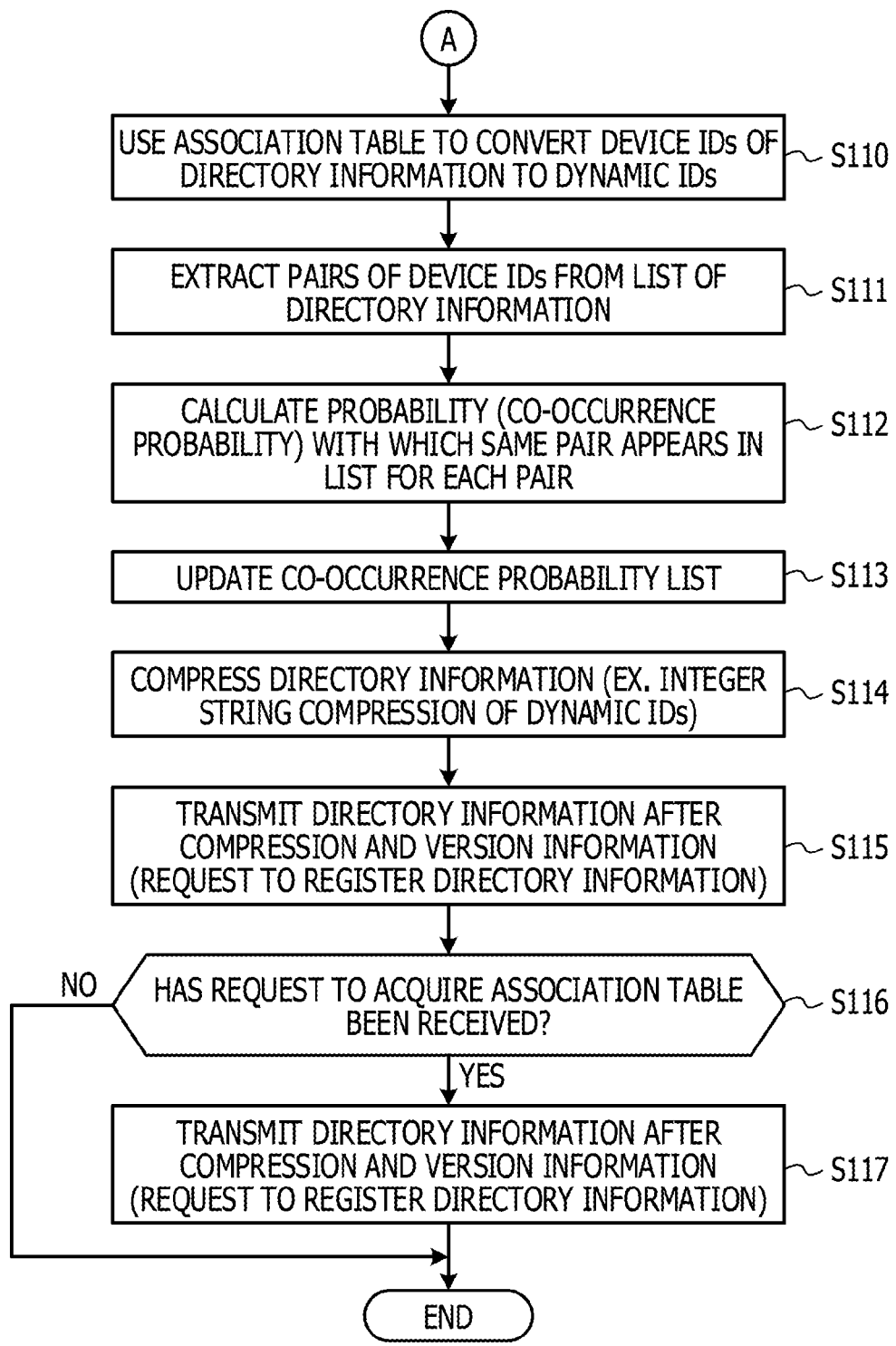
FIG. 19 is a second flow diagram describing the operations of the GW device according to the second embodiment.
Figure 20:
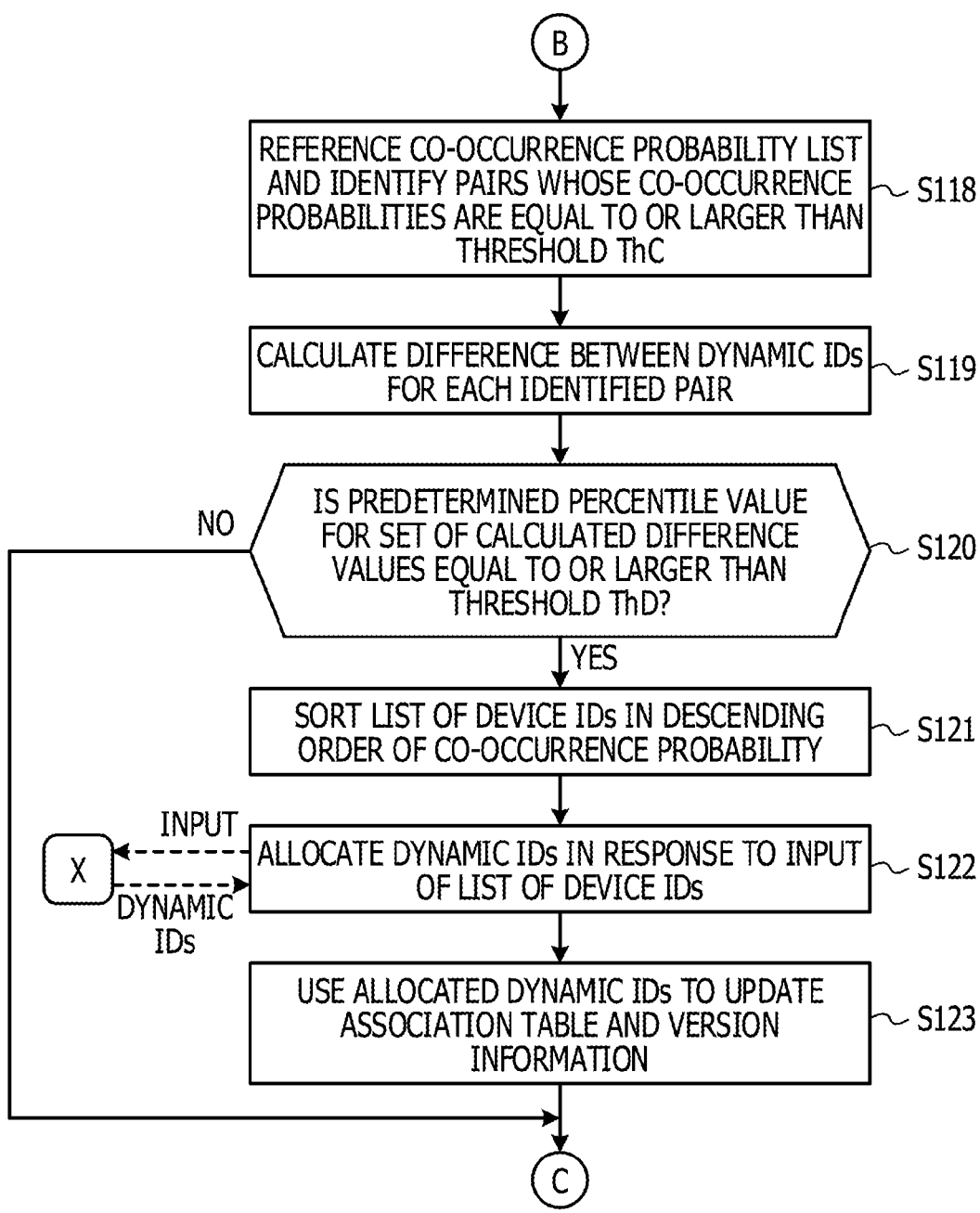
FIG. 20 is a third flow diagram describing the operations of the GW device according to the second embodiment.
Figure 21:
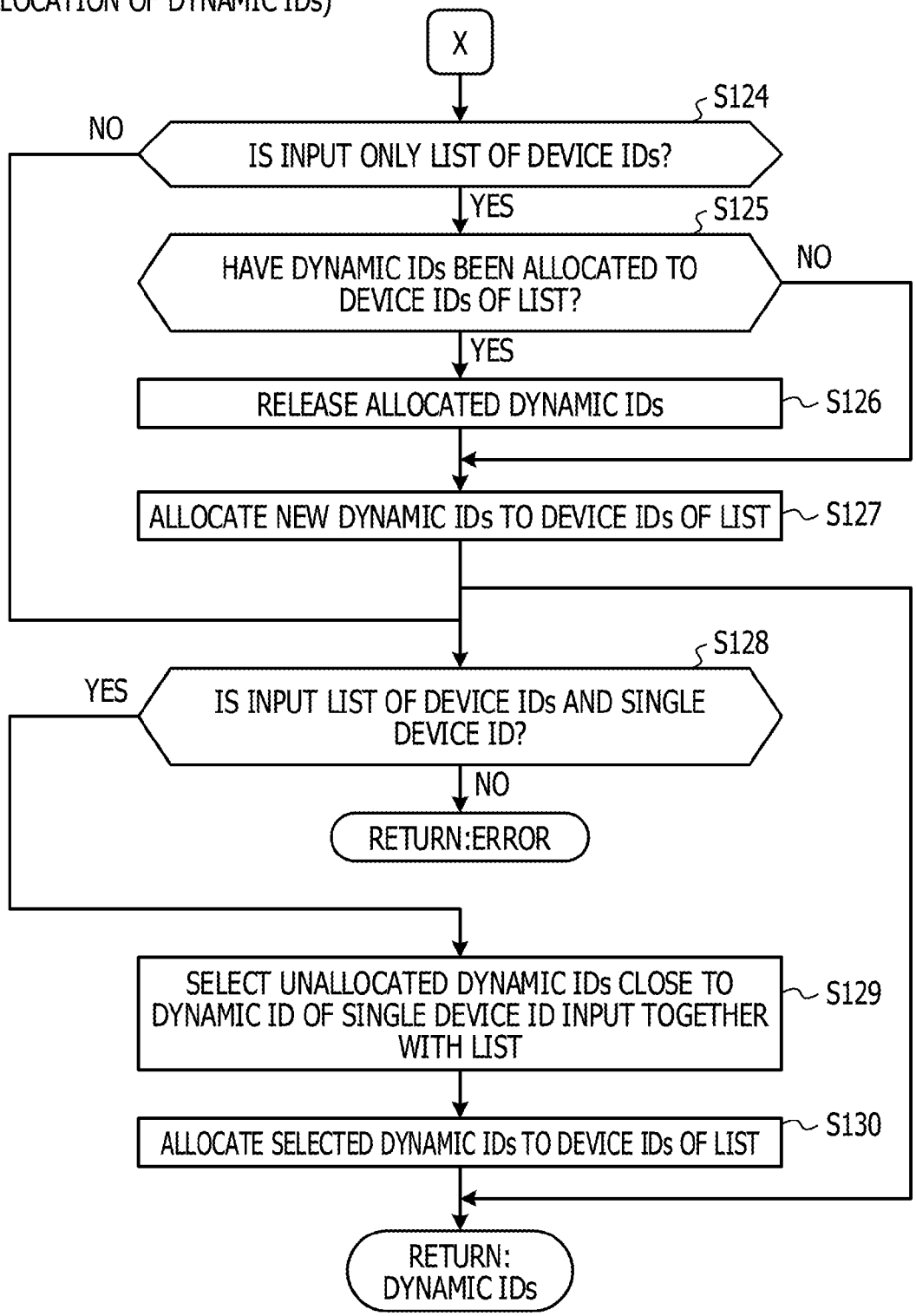
FIG. 21 is a flow diagram illustrating the flow of a process related to the allocation of dynamic IDs.

FIG. 18 is a first flow diagram describing operations of the GW device according to the second embodiment. FIG. 19 is a second flow diagram describing the operations of the GW device according to the second embodiment. FIG. 20 is a third flow diagram describing the operations of the GW device according to the second embodiment. FIG. 21 is a flow diagram illustrating the flow of a process related to the allocation of dynamic IDs.

<S101> The directory information acquirer 112 of the GW device 101 receives a request to register directory information DIR and causes an entry of the received directory information DIR to be stored in a buffer (accumulated information list 111a of the storage section 111).

<S102> The dynamic ID managing section 114 determines whether or not the current time has reached execution time TP1 when a process of registering the directory information DIR included in the accumulated information list 111a is executed. For example, the execution time TP1 is set to time after predetermined time (of 10 seconds or the like) elapses after the execution of the previous registration process. If the current time has reached the execution time TP1, the process proceeds to S104. On the other hand, if the current time has not reached the execution time TP1, the process proceeds to S103.

<S103> The dynamic ID managing section 114 determines whether or not the current time has reached execution time TP2 when a process of reallocating dynamic IDs is executed. For example, the execution time TP2 is set to time after predetermined time (of 30 seconds or the like) elapses after the completion of a process of updating the association table 111b. If the current time has reached the execution time TP2, the process proceeds to S118. On the other hand, if the current time has not reached the execution time TP2, the process proceeds to S101.

<S104> The dynamic ID managing section 114 reads the list (accumulated information list 111a) of the directory information DIR from the storage section 111.

<S105> The dynamic ID managing section 114 cross-checks device IDs of the directory information DIR included in the list (accumulated information list 111a) read from the storage section 111 with device IDs included in the association table 111b. Then, the dynamic ID managing section 114 determines whether or not all the device IDs of the list are absent in the association table 111b. If all the device IDs of the list are absent in the association table 111b, the process proceeds to S106. On the other hand, if one or more device IDs of the list exist in the association table 111b, the process proceeds to S107.

<S106> The dynamic ID managing section 114 executes a process of allocating dynamic IDs in response to the input of information (list of all the device IDs) of the device IDs included in the accumulated information list 111a and a single device ID among the device IDs included in the association table 111b. Specifically, the dynamic ID managing section 114 notifies, to the allocation managing section 115, an allocation request specifying the list of all the device IDs and the arbitrary device ID included in the association table 111b and receives the allocation of the dynamic IDs to all the device IDs. A process of allocating the dynamic IDs by the allocation managing section 115 is described later. When the process of S106 is completed, the process proceeds to S109.

<S107> The dynamic ID managing section 114 determines whether or not a device ID that is included in the accumulated information list 111a and is not included in the association table 111b exists. If the device ID that is not included in the association table 111b exists, the process proceeds to S108. On the other hand, if the device ID that is not included in the association table 111b does not exist (or if all the device IDs of the list exist in the association table 111b), the process proceeds to S110.

<S108> The dynamic ID managing section 114 executes a process of allocating dynamic IDs in response to the input of information (list of the device IDs) of the device IDs included in the accumulated information list 111a. Specifically, the dynamic ID managing section 114 notifies, to the allocation managing section 115, an allocation request including the list of the device IDs and receives the allocation of the dynamic IDs in response to the allocation request. The process of allocating the dynamic IDs by the allocation managing section 115 is described later.

<S109> The dynamic ID managing section 114 uses the dynamic IDs allocated by the allocation managing section 115 to update the association table 111b. In this case, the dynamic ID managing section 114 updates the version information of the association table 111b.

<S110> The compression processing section 113 uses the association table 111b to converts the device IDs, included in the accumulated information list 111a, of the directory information DIR to the dynamic IDs.

<S111> The dynamic ID managing section 114 extracts pairs of device IDs from the list (accumulated information list 111a) of the directory information DIR. For example, the dynamic ID managing section 114 searches all pairs of device IDs from a set of the device IDs included in the accumulated information list 111a and extracts the pairs of device IDs.

<S112> The dynamic ID managing section 114 calculates, for each of the pairs, a probability (co-occurrence probability) with which the same pair (pair of device IDs) appears in the list (accumulated information list 111a). For example, if the number of times that the compression is executed is N, and the number of times that the same specific pair of device IDs appears in the accumulated information list 111a of device IDs to be compressed is n, a co-occurrence probability for the specific device IDs is expressed by n/N.

<S113> The dynamic ID managing section 114 updates the co-occurrence probability list 111c based on the co-occurrence probabilities calculated for the pairs.

<S114> The compression processing section 113 compresses the directory information DIR after the ID conversion executed to convert the device IDs to the dynamic IDs. For example, the compression processing section 113 executes the integer sequence compression on the dynamic IDs to compress the directory information DIR.

<S115> The compression processing section 113 transmits, as a request to register the directory information DIR, the directory information DIR after the compression and the version information of the association table 111b to the DS device 200.

<S116> The dynamic ID managing section 114 determines whether or not the dynamic ID managing section 114 has received, from the DS device 200, a notification (request to acquire the association table) indicating a request to transmit the association table 111b. If the dynamic ID managing section 114 has received the request to acquire the association table, the process proceeds to S117. On the other hand, if the dynamic ID managing section 114 has not received the request to acquire the association table, a series of processes illustrated in FIGS. 18 to 21 is terminated.

<S117> The dynamic ID managing section 114 transmits, to the DS device 200, the association table 111b as a response to the request to acquire the association table. When the process of S117 is completed, the series of processes illustrated in FIGS. 18 to 21 is terminated.

<S118> The dynamic ID managing section 114 references the co-occurrence probability list 111c and identifies pairs (pairs of device IDs) whose co-occurrence probabilities are equal to or larger than the threshold ThC.

<S119> The dynamic ID managing section 114 calculates the difference between dynamic IDs for each of the identified pairs. Specifically, the dynamic ID managing section 114 references the association table 111b, extracts pairs of dynamic IDs corresponding to the pairs of device IDs whose co-occurrence probabilities are equal to or larger than the threshold ThC (of, for example, 0.6), and calculates difference values between the dynamic IDs for the extracted pairs of dynamic IDs.

<S120> The dynamic ID managing section 114 determines whether or not a predetermined percentile value (for example, a difference value below which 80% of all the calculated difference values fall) for a set of the calculated difference values is equal to or larger than the threshold ThD (of, for example, 127). If the predetermined percentile value is equal to or larger than the threshold ThD, the process proceeds to S121. On the other hand, if the predetermined percentile value is neither equal to nor larger than the threshold ThD, the process proceeds to S101.

<S121> The dynamic ID managing section 114 references the co-occurrence probability list 111c and sorts a list of device IDs included in the co-occurrence probability list 111c in descending order of co-occurrent probability.

<S122> The dynamic ID managing section 114 executes a process of allocating dynamic IDs in response to the input of information (list of the device IDs) of the device IDs included in the co-occurrence probability list 111c. Specifically, the dynamic ID managing section 114 notifies, to the allocation managing section 115, an allocation request including the list of the device IDs and receives the allocation of the dynamic IDs in response to the allocation request. A process of allocating the dynamic IDs by the allocation managing section 115 is described later.

<S123> The dynamic ID managing section 114 uses the dynamic IDs allocated by the allocation managing section 115 to update the association table 111b. In this case, the dynamic ID managing section 114 updates the version information of the association table 111b. When the process of S123 is completed, the process proceeds to S101.

The process of allocating the dynamic IDs by the allocation managing section 115 is described below.

<S124> The allocation managing section 115 that has received the allocation request from the dynamic ID managing section 114 determines whether or not the input is only the list of the device IDs. If the input is only the list of the device IDs, the process proceeds to S125. On the other hand, if the input is not only the list of the device IDs, the process proceeds to S128.

<S125> The allocation managing section 115 references the dynamic ID pool 111d and determines whether or not dynamic IDs have been already allocated to the device IDs included in the input list. If the dynamic IDs have been already allocated to the device IDs included in the input list, the process proceeds to S126. On the other hand, if the dynamic IDs have not been allocated to the device IDs included in the input list, the process proceeds to S127.

<S126> The allocation managing section 115 releases the dynamic IDs allocated to the device IDs included in the input list. Specifically, the allocation managing section 115 sets, to "not used", the dynamic IDs associated with the device IDs of the input list among device IDs described in the dynamic ID pool 111d.

<S127> The allocation managing section 115 allocates new dynamic IDs to the device IDs of the input list. For example, the allocation managing section 115 allocates the dynamic IDs to the device IDs in order from the top or bottom ID of the list so that adjacent dynamic IDs are closest to each other. Then, the allocation managing section 115 notifies, to the dynamic ID managing section 114, the dynamic IDs allocated to the device IDs as a response to the allocation request. When the process of S127 is completed, a series of processes illustrated in FIG. 21 is terminated.

<S128> The allocation managing section 115 determines whether or not the input is the list of the device IDs and a single device ID. If the input is the list of the device IDs and the single device ID, the process proceeds to S129. On the other hand, if the input is not the list of the device IDs and the single device ID, the allocation managing section 115 outputs an error indicating that the process of allocating dynamic IDs has failed, and the allocation managing section 115 terminates the series of processes illustrated in FIG. 21.

<S129> The allocation managing section 115 references the dynamic ID pool 111d and selects unallocated dynamic IDs close to a dynamic ID of the single device ID input together with the list.

<S130> The allocation managing section 115 allocates the dynamic IDs selected in S129 to the devices IDs of the list. Then, the allocation managing section 115 notifies, to the dynamic ID managing section 114, the dynamic IDs allocated to the device IDs as a response to the allocation request. When the process of S130 is completed, the series of processes illustrated in FIG. 21 is terminated.

The flow of the process to be executed by the GW device 101 is described above.

MODIFIED EXAMPLE

Determination of Reallocation Based on Compression Rate

A modified example of the second embodiment is described with reference to FIGS. 22 and 23. In the second embodiment, co-occurrence probabilities of device IDs are used for the reallocation of dynamic IDs. Co-occurrence probabilities of device IDs are not used in the modified example described below, and the modified example is related to a method for using the rate of compressing directory information DIR to determine whether or not dynamic IDs are to be reallocated.

Figure 22:
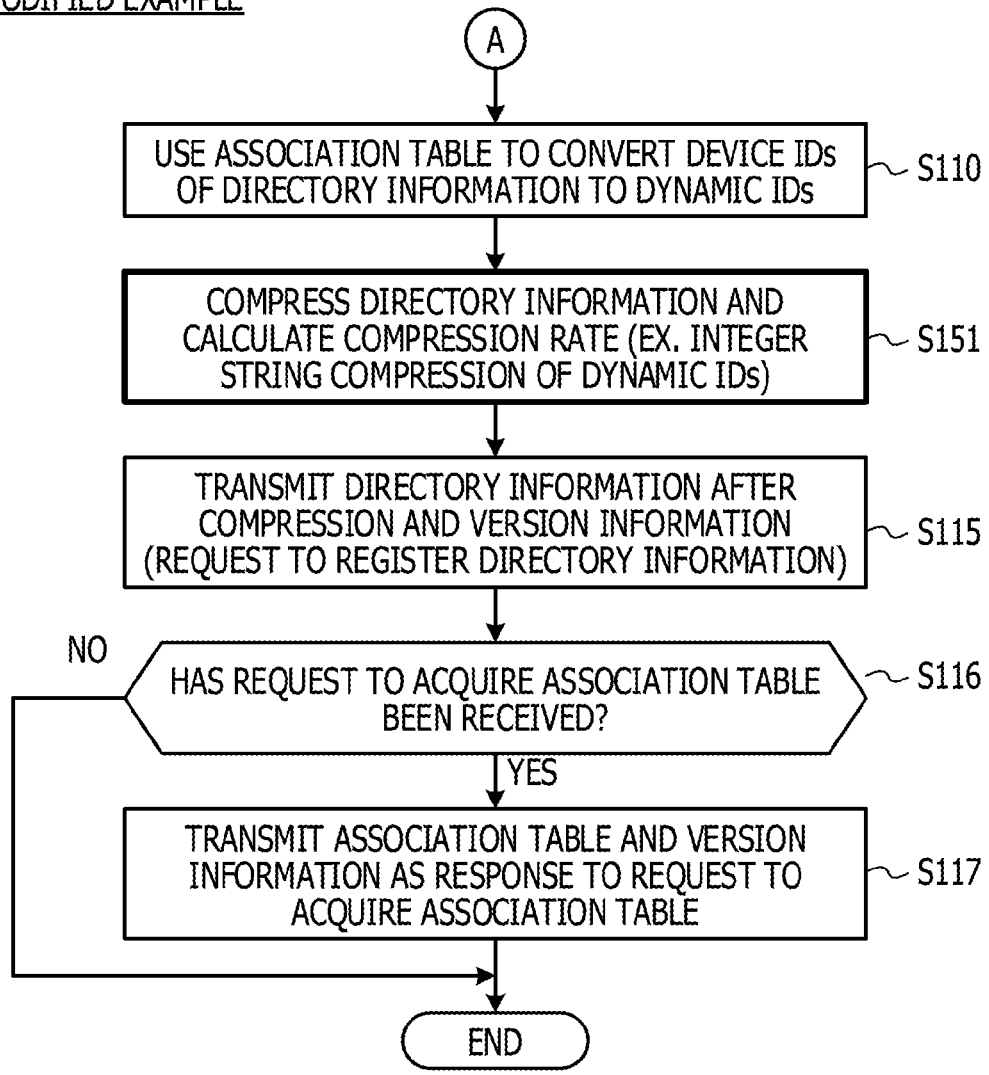
FIG. 22 is a first flow diagram describing operations of the GW device according to a modified example of the second embodiment.

FIG. 22 is a first flow diagram describing operations of the GW device according to the modified example of the second embodiment. FIG. 23 is a second flow diagram describing the operations of the GW device according to the modified example of the second embodiment.

In this modified example, the process flow illustrated in FIG. 19 is modified to the flow illustrated in FIG. 22. Specifically, the processes of S111 to S114 are omitted and a process of S151 is added. In the process of S151, the compression processing section 113 calculates the compression rate upon the compression of the directory information DIR. As the compression rate, the ratio of the size of data after the compression of data of a set of directory information DIR to be compressed with respect to the size of data before the compression of the data of the set of directory information DIR to be compressed may be applied. Specifically, the compression rate given by the aforementioned Equation (1) may be applied.

$$\text{The compression rate} = \text{the size of the data after the compression}/\text{the size of the data before the compression} \quad (1)$$

Figure 23:
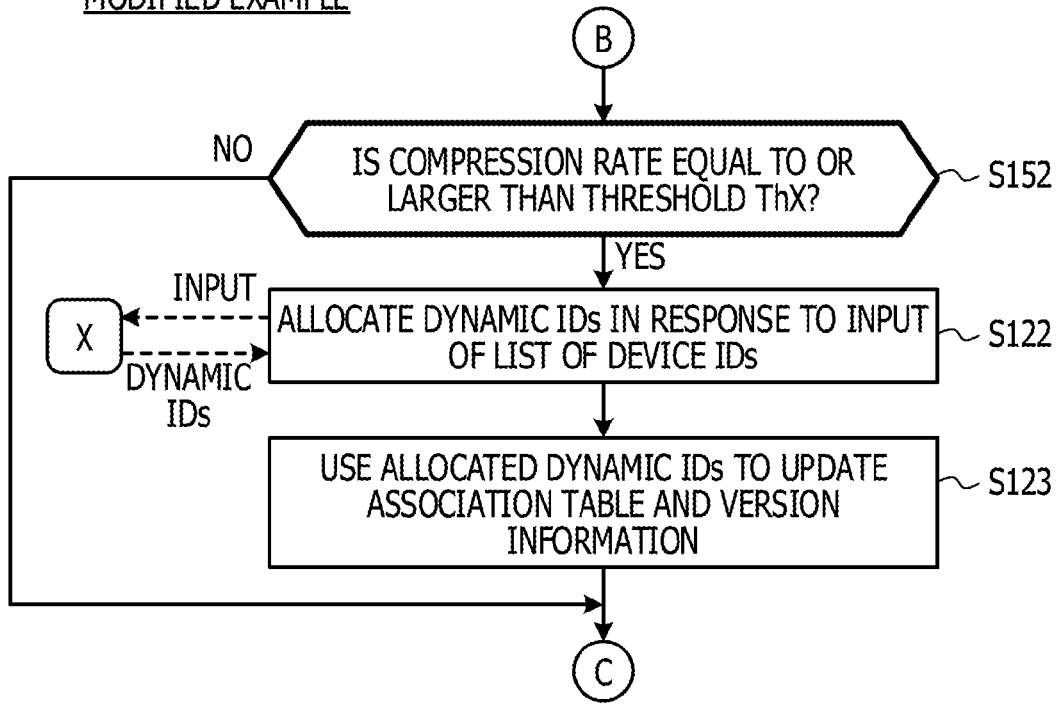
FIG. 23 is a second flow diagram describing the operations of the GW device according to the modified example of the second embodiment.

In addition, the process flow illustrated in FIG. 20 is modified to a flow illustrated in FIG. 23. Specifically, the processes of S118 to S121 are omitted and a process of S152 is added. In the process of S152, the dynamic ID managing section 114 compares the latest compression rate with a predetermined threshold ThX. Then, if the compression rate is equal to or larger than the threshold ThX, the process proceeds to S122. On the other hand, if the compression rate is neither equal to nor larger than the threshold ThX, the process proceeds to S101. In this manner, the calculation related to co-occurrence probabilities may be omitted by applying the aforementioned modified example, and the modified example contributes to a reduction in the calculation load. The modified example also belongs to a technical range of the second embodiment.

(Flow of Process by DS Device)

Figure 24:
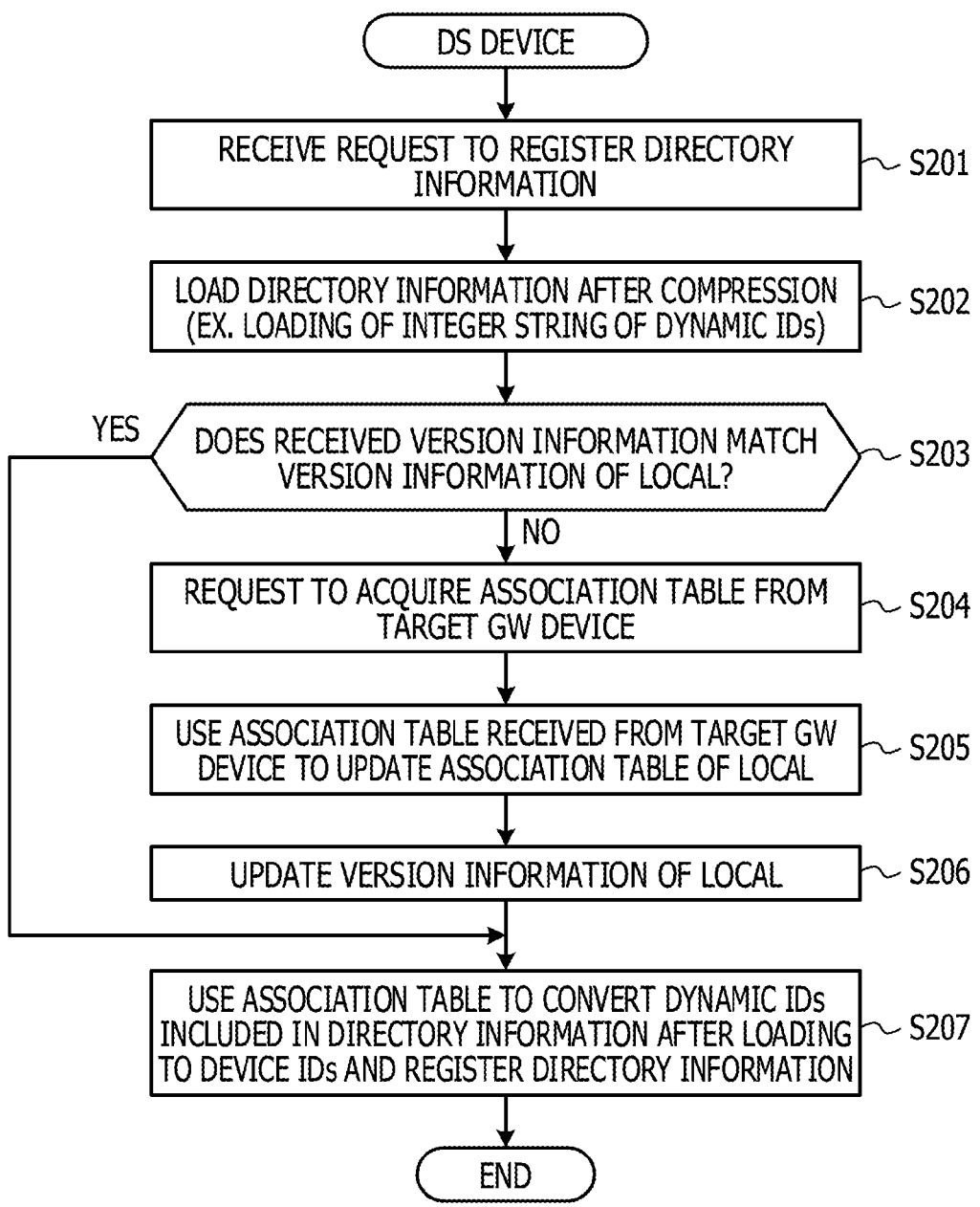
FIG. 24 is a flow diagram describing operations of the DS device according to the second embodiment.

The flow of a process to be executed by the DS device 200 is described with reference to FIG. 24. FIG. 24 is a flow diagram describing operations of the DS device according to the second embodiment.

<S201> The loading processing section 202 of the DS device 200 receives a request to register the directory information DIR from the GW device 101. In this case, the loading processing section 202 receives the directory information DIR after the compression and the version information of the association table 111b from the GW device 101.

<S202> The loading processing section 202 loads the directory information DIR after the compression. For example, if dynamic IDs are already subjected to the integer sequence compression, the loading processing section 202 references the delimiter bit and restores the original bit sequence indicating the dynamic IDs (loading of the integer sequence of the dynamic IDs).

<S203> The loading processing section 202 determines whether or not the version information received from the GW device 101 matches version information of a local (version management information 201b). If the received version information matches the version information of the local, the process proceeds to S207. If the received version information does not match the version information of the local, the process proceeds to S204.

<S204> The loading processing section 202 requests the GW device 101 (target GW device) to transmit the association table 111b (the issuance of a request to acquire the association table).

<S205> The loading processing section 202 receives the association table 111b transmitted by the GW device 101 (target GW device) in response to the request to acquire the association table and uses the received association table 111b to update the association table (association table group 201a) of the local.

<S206> The loading processing section 202 updates the version information (version management information 201b) of the local for the GW device 101.

<S207> The loading processing section 202 uses the association table (association table #1), included in the association table group 201a after the update, of the GW device 101 to convert the dynamic IDs included in the directory information DIR after the loading to the device IDs. The information registering section 203 registers the directory information DIR after the ID conversion by the loading processing section 202 in the registered information 201c. When the process of S207 is completed, a series of processes illustrated in FIG. 24 is terminated.

The flow of the process to be executed by the DS device 200 is described above.

As described above, the compression rate may be improved by converting device IDs to dynamic IDs and executing the compression. In addition, even if a combination of device IDs to be simultaneously compressed is changed, a stably high compression rate may be achieved by reallocating dynamic IDs.

The second embodiment is described above.

All examples and conditional language recited herein of the RFID tag and the high frequency circuit are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method performed by a computer for management of distributed data, the method comprising:

associating, by a processor of the computer, device information items including information acquired from devices with first identification information items to be used to identify the devices and storing the device information items and the first identification information items in a storage device;

calculating, by the processor of the computer, co-occurrence probabilities of combinations of the associated first identification information items for the device information items stored in the storage device;

assigning, by the processor of the computer, second identification information items to the first identification information items based on the co-occurrence probabilities;

generating, by the processor of the computer, compressed data by compressing the device information items using the second identification information items assigned to the first identification information items associated with the device information items upon the compression of the device information items; and transmitting, by the processor of the computer, the compressed data to a managing device.

2. The method according to claim 1, wherein a process of assigning the second identification information items includes assigning a pair of the second identification information items between which difference is smaller than a predetermined value to combinations of first identification information items whose co-occurrence probabilities are larger than a first threshold, and wherein integer sequence compression is used for the compression of the device information items, the integer sequence compression being able to compress the device information into smaller bits sequence according as deference between the pair of the second identification information items is smaller.

3. The method according to claim 1, wherein a process of assigning the second identification information items includes referencing association information indicating association relationships between the first identification information items and the second identification information items, selecting combinations of first identification information items whose co-occurrence probabilities are larger than a first threshold among the multiple first identification information items indicated in the association information, acquiring, from the association information, combinations of second identification information items associated with the selected combinations of first identification information items, and updating the second identification information items assigned to the first identification information items indicated in the association information if the ratio of the number of combinations of second identification information items between which differences are smaller than a predetermined value with respect to the number of combinations of the second identification information items is smaller than a second threshold.

4. The method according to claim 1, wherein a process of assigning the second identification information items includes selecting a predetermined number of combinations of first identification information items in descending order of co-occurrence probability and assigning combinations of second identification information items between which differences are smaller than a predetermined value to the selected combinations of first identification information items.

5. The method according to claim 1, further comprising:

transmitting, to the managing device, a second device information item indicating a logical position at which a device information item acquired by another computer exists.

6. An apparatus for management of distributed data, the apparatus comprising:

a memory; and a processor coupled to the memory and configured to associate device information items including information acquired from devices with first identification information items to be used to identify the devices and storing the device information items and the first identification information items in a storage device, calculate co-occurrence probabilities of combinations of the associated first identification information items for the device information items stored in the storage device, assign second identification information items to the first identification information items based on the co-occurrence probabilities, generate compressed data by compressing the device information items using the second identification information items assigned to the first identification information items associated with the device information items upon the compression of the device information items, and transmit the compressed data to a managing device.

7. A non-transitory computer-readable storage medium for storing a program for management of distributed data, the program causing a processor to execute a process, the process comprising:

associating device information items including information acquired from devices with first identification information items to be used to identify the devices and storing the device information items and the first identification information items in a storage device;

calculating co-occurrence probabilities of combinations of the associated first identification information items for the device information items stored in the storage device;

assigning second identification information items to the first identification information items based on the co-occurrence probabilities;

generating compressed data by compressing the device information items using the second identification information items assigned to the first identification information items associated with the device information items upon the compression of the device information items; and transmitting the compressed data to a managing device.

* * * * *